(12) United States Patent
Endo et al.

(10) Patent No.: US 7,176,617 B2
(45) Date of Patent: Feb. 13, 2007

(54) COMPOSITION, METHOD OF FORMING FILM, FILM FORMATION DEVICE, ELECTRO-OPTICAL DEVICE, METHOD OF MANUFACTURING THE SAME, ORGANIC ELECTROLUMINESCENT DEVICE, METHOD OF MANUFACTURING THE SAME, DEVICE AND METHOD OF MANUFACTURING THE SAME, AND ELECTRONIC APPARATUS

(75) Inventors: Ayae Endo, Nagano-ken (JP); Shunichi Seki, Suwa (JP)

(73) Assignee: Seiko Epson Corporation (JP)

( * ) Notice: Subject to any disclaimer, the term of this patent is extended or adjusted under 35 U.S.C. 154(b) by 233 days.

(21) Appl. No.: 10/611,407

(22) Filed: Jul. 1, 2003

(65) Prior Publication Data
US 2004/0075383 A1 Apr. 22, 2004

(30) Foreign Application Priority Data
Jul. 1, 2002 (JP) .............................. 2002-192195

(51) Int. Cl.
*H05B 33/00* (2006.01)
(52) U.S. Cl. ....................................... 313/504; 313/506
(58) Field of Classification Search ................ 313/504, 313/506; 428/690, 917; 445/24
See application file for complete search history.

(56) References Cited

U.S. PATENT DOCUMENTS

| 5,965,281 | A | * | 10/1999 | Cao | 428/690 |
| 6,066,357 | A | | 5/2000 | Tang et al. | |
| 6,566,808 | B1 | | 5/2003 | Duggal et al. | |
| 6,593,687 | B1 | * | 7/2003 | Pei et al. | 313/504 |
| 2001/0001050 | A1 | * | 5/2001 | Miyashita et al. | 428/690 |
| 2003/0010959 | A1 | * | 1/2003 | Lee et al. | 252/500 |
| 2003/0175552 | A1 | * | 9/2003 | Imamura et al. | 428/690 |

FOREIGN PATENT DOCUMENTS

| JP | 11-209669 | | 8/1999 |
| JP | 2000-178490 | | 6/2000 |
| JP | 2000-327968 | | 11/2000 |
| JP | 2001-297879 | | 10/2001 |
| JP | 2002-182380 | | 6/2002 |
| KR | 2001/0062574 | * | 7/2001 |
| WO | WO 01/41229 A1 | | 6/2001 |

* cited by examiner

*Primary Examiner*—Ashok Patel
(74) *Attorney, Agent, or Firm*—Harness, Dickey & Pierce, P.L.C.

(57) ABSTRACT

A film formation device includes a liquid material composition generating device for generating a liquid material composition containing a organic functional material, a solvent, and a surfactant, and a liquid droplet ejecting device for ejecting liquid droplets made therefrom onto a substrate P.

2 Claims, 17 Drawing Sheets

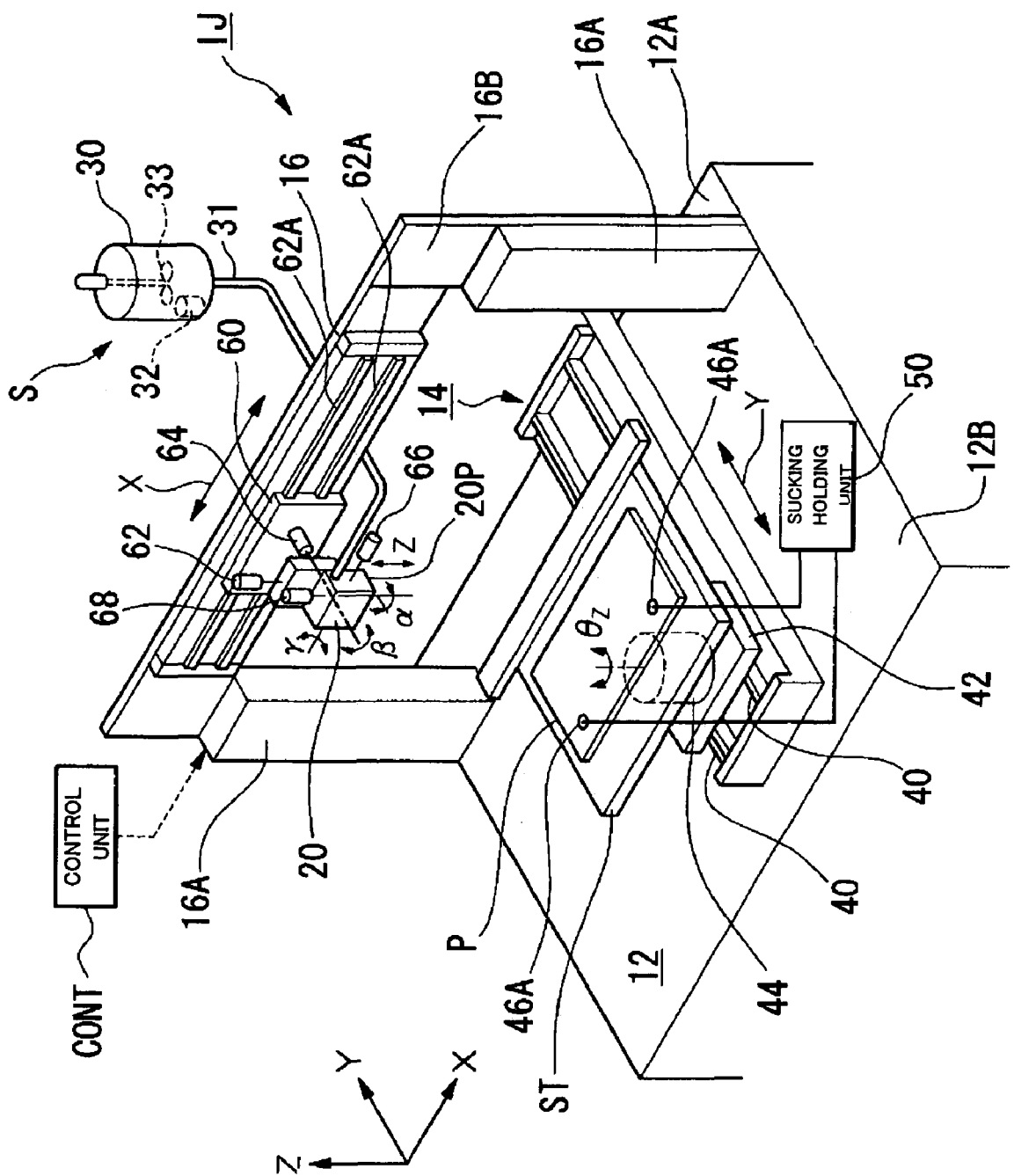
[Fig. 1]

[Fig. 2]
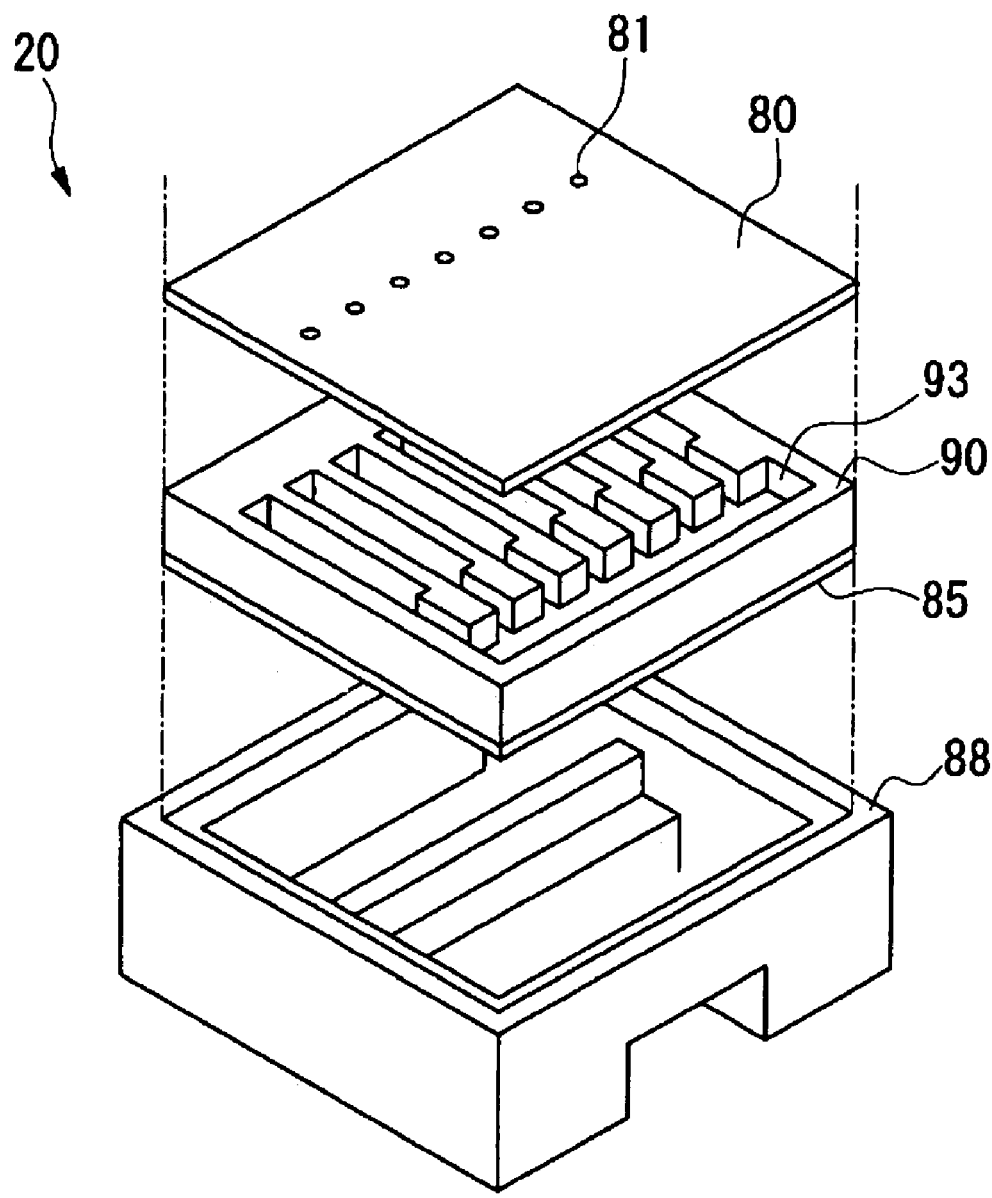

[Fig. 3]
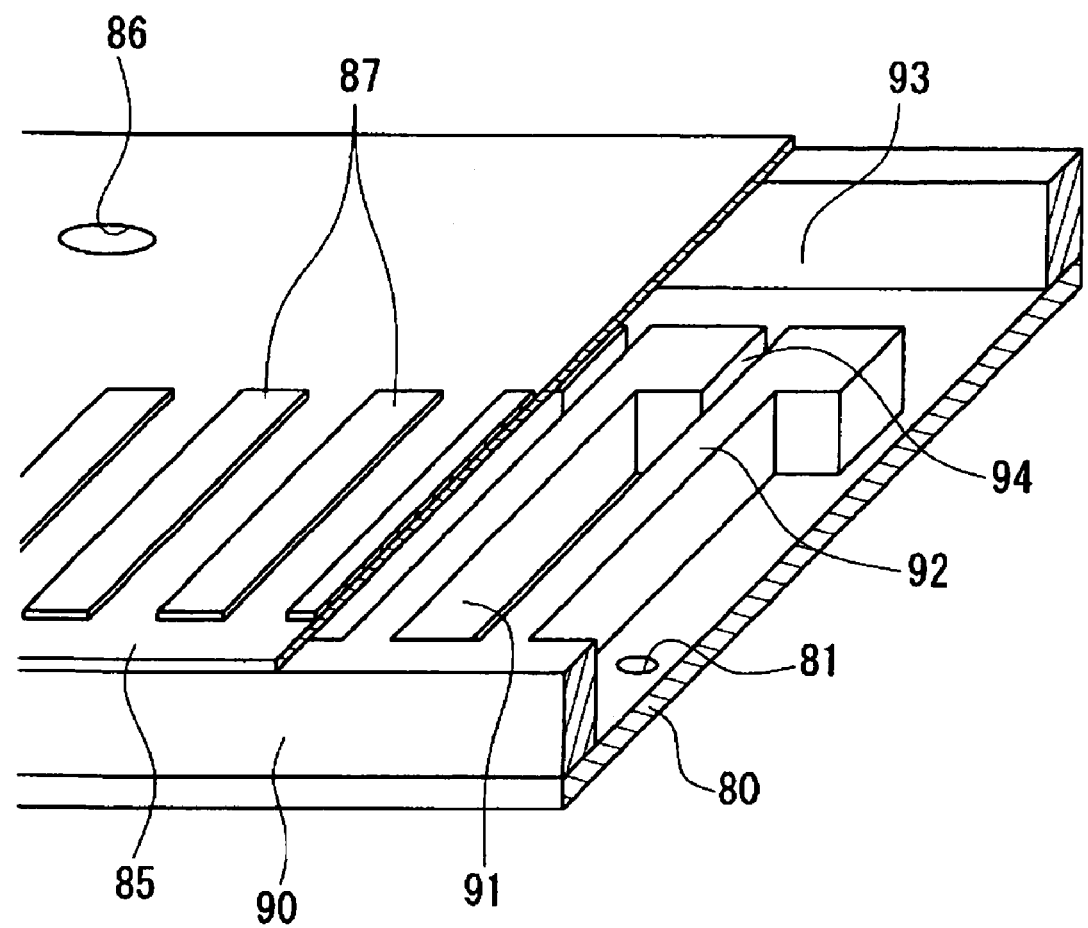

[Fig. 4]
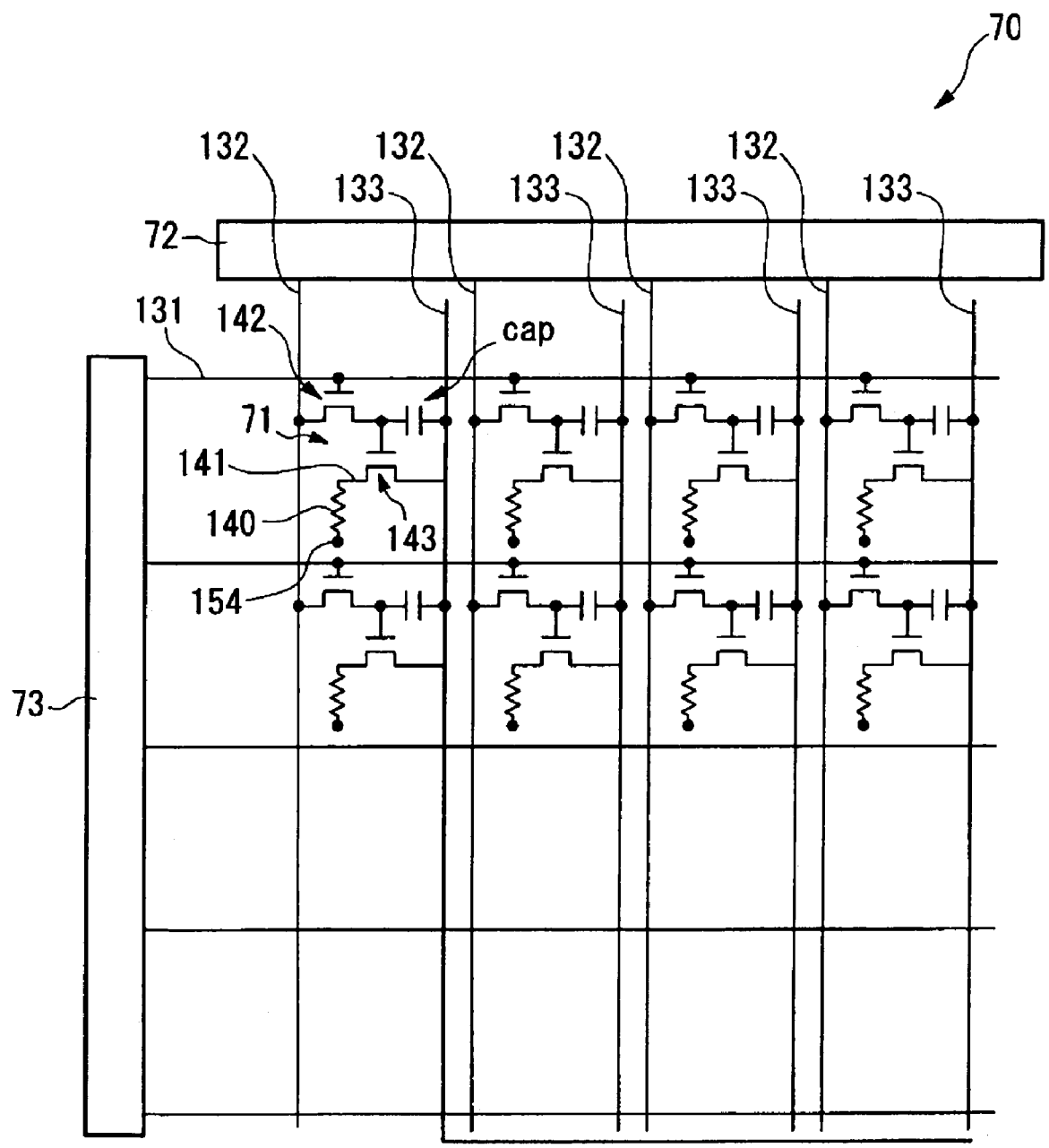

[Fig. 5]
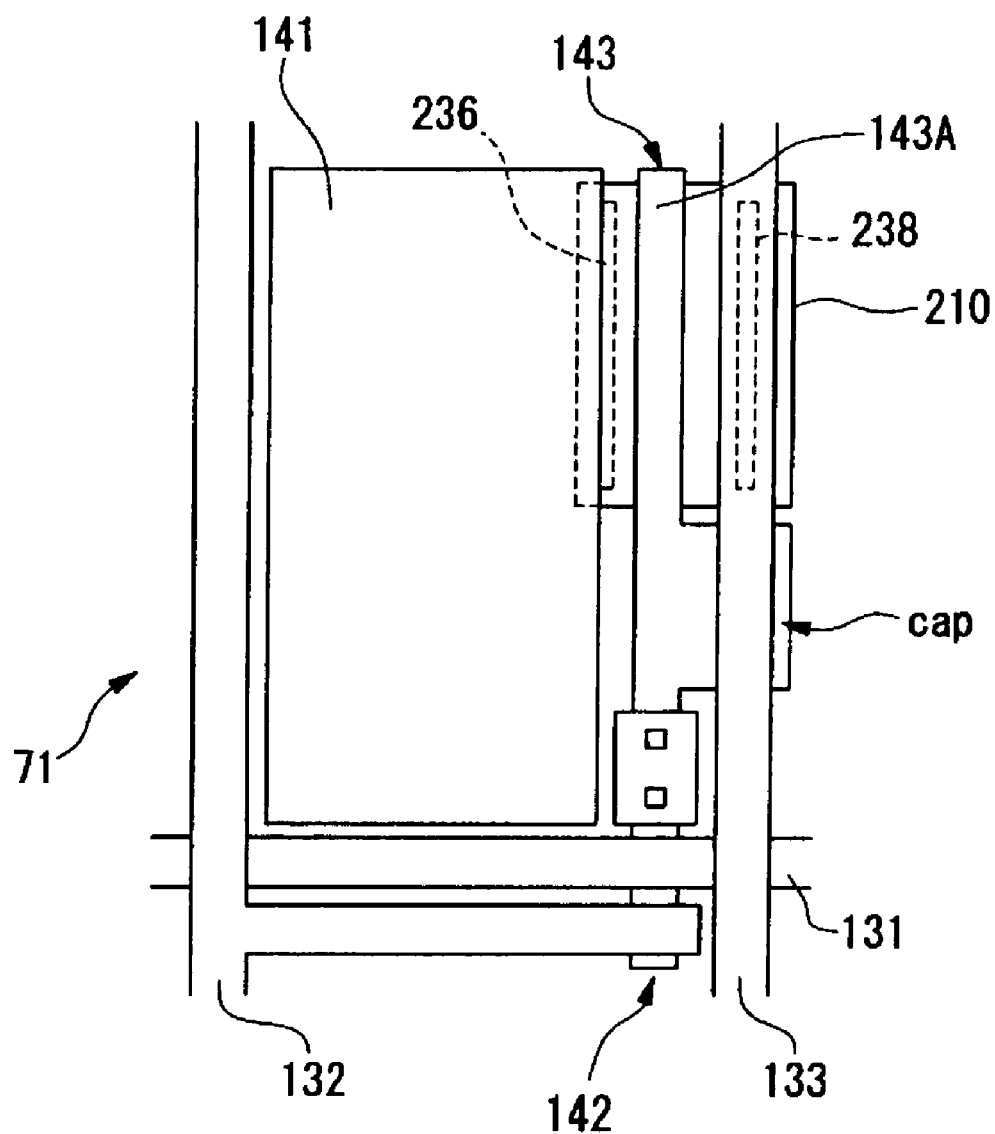

[Fig. 6]
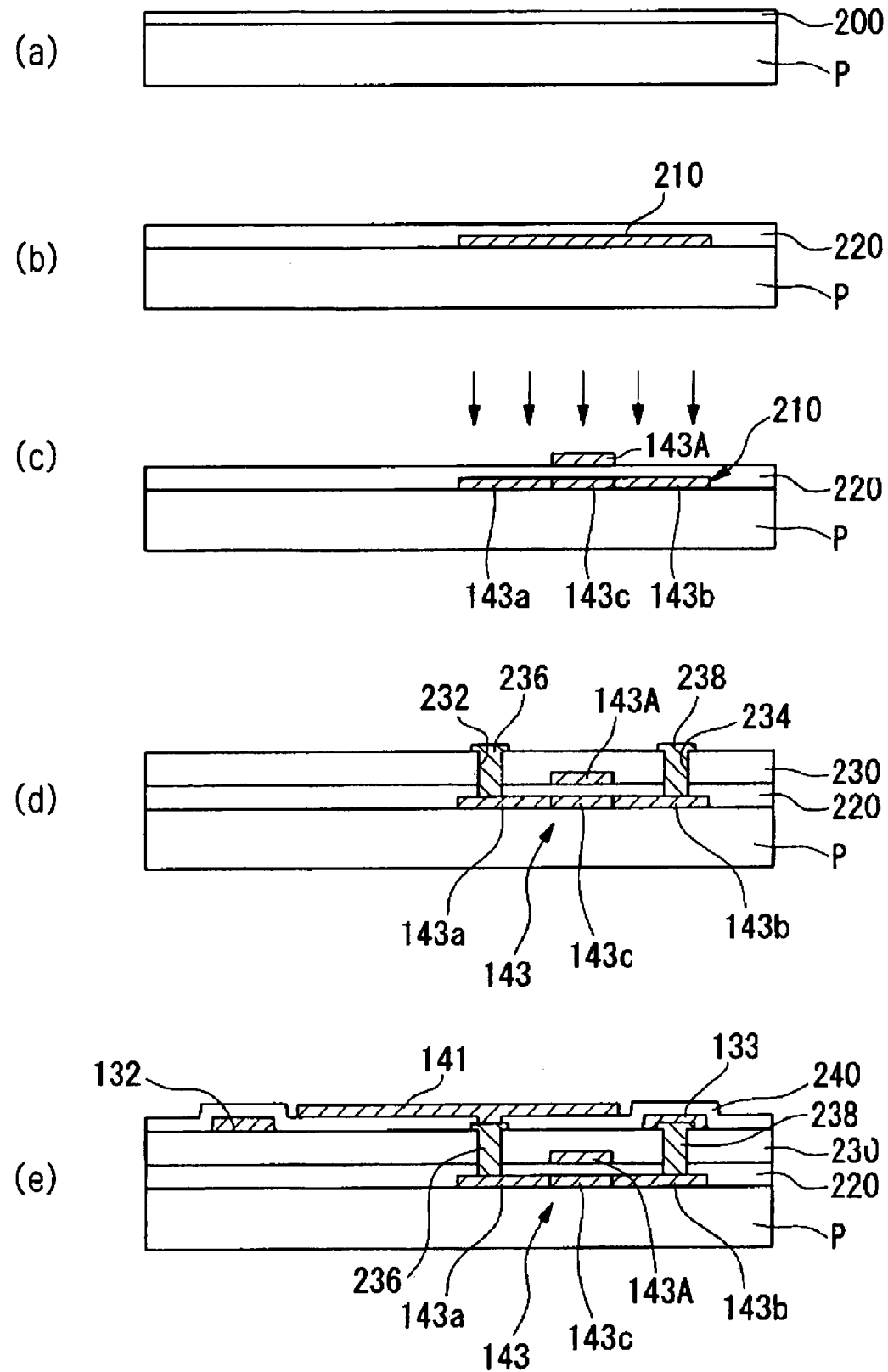

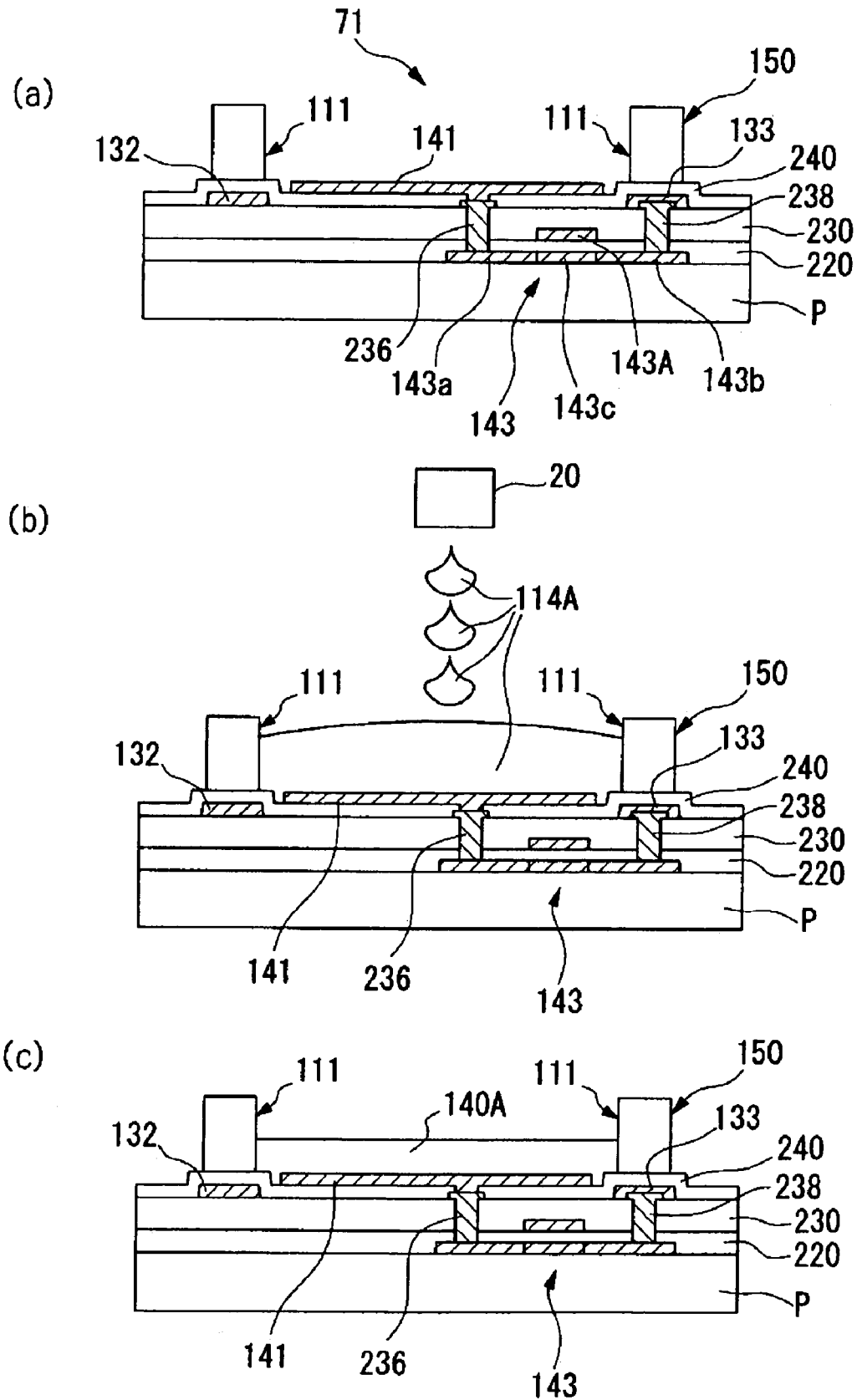
[Fig. 7]

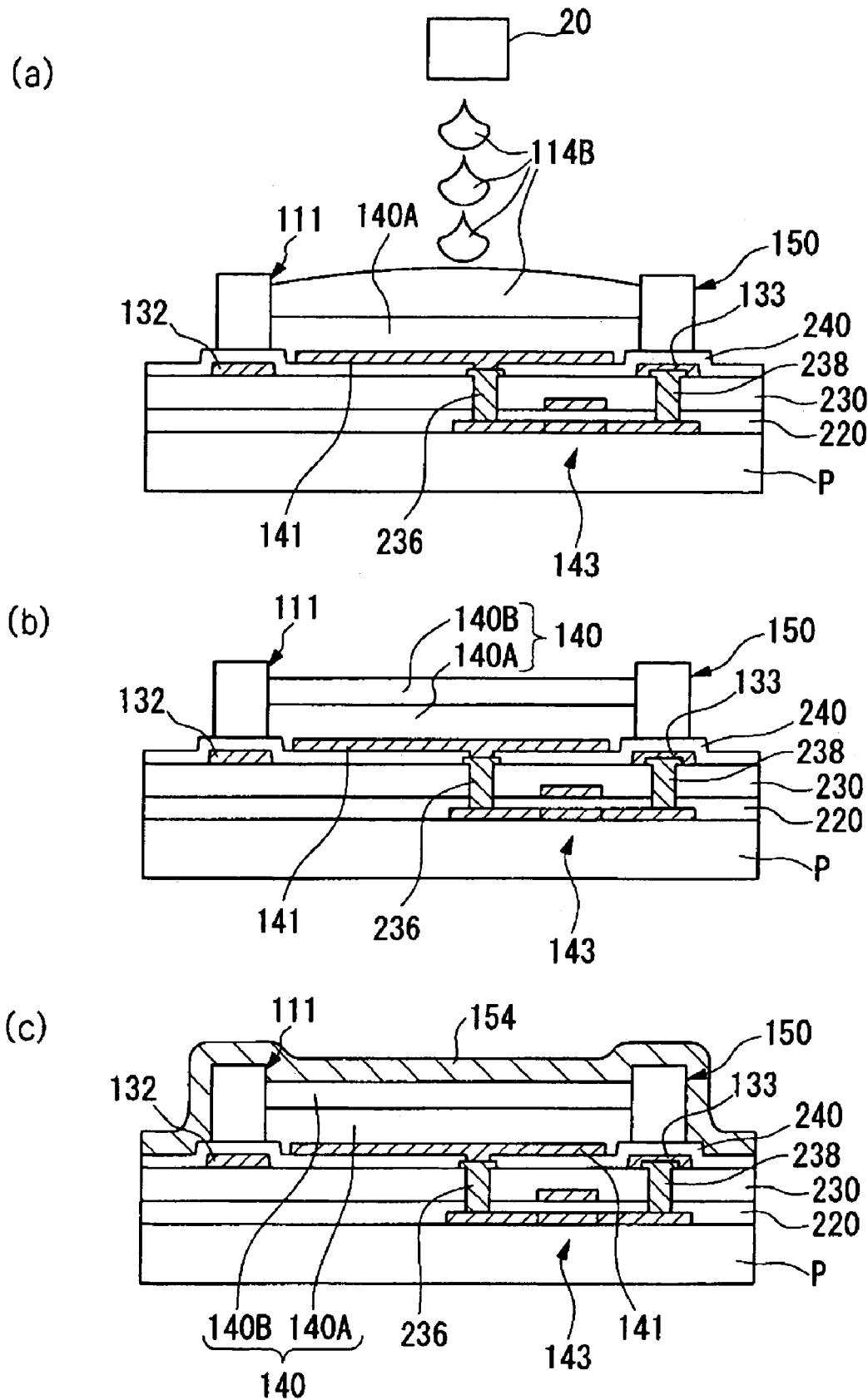
[Fig. 8]

[Fig. 9]
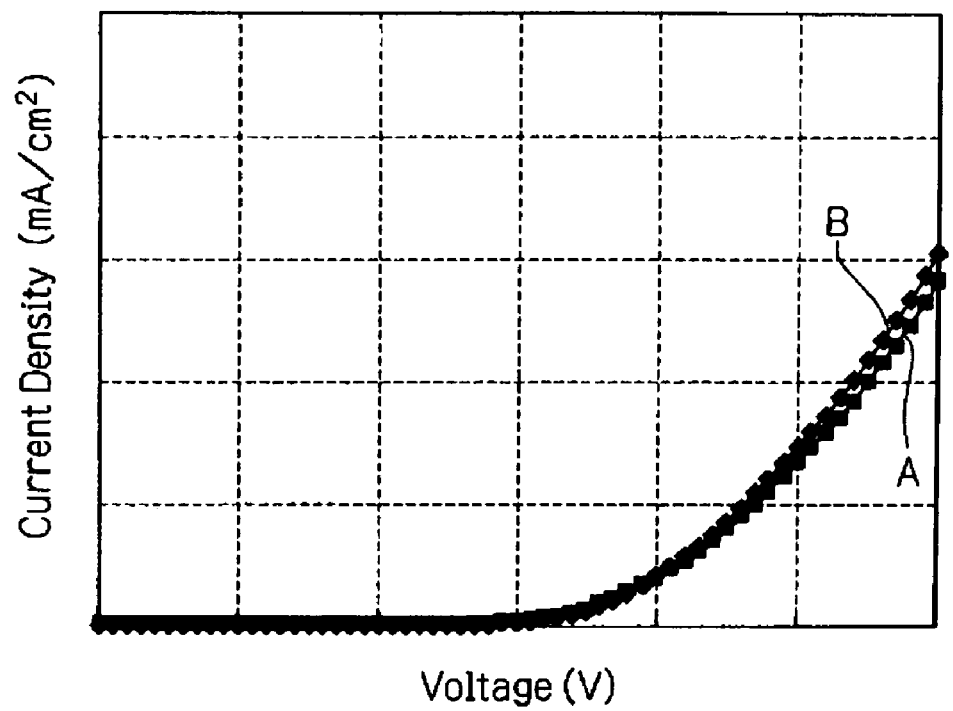
[Fig. 10]
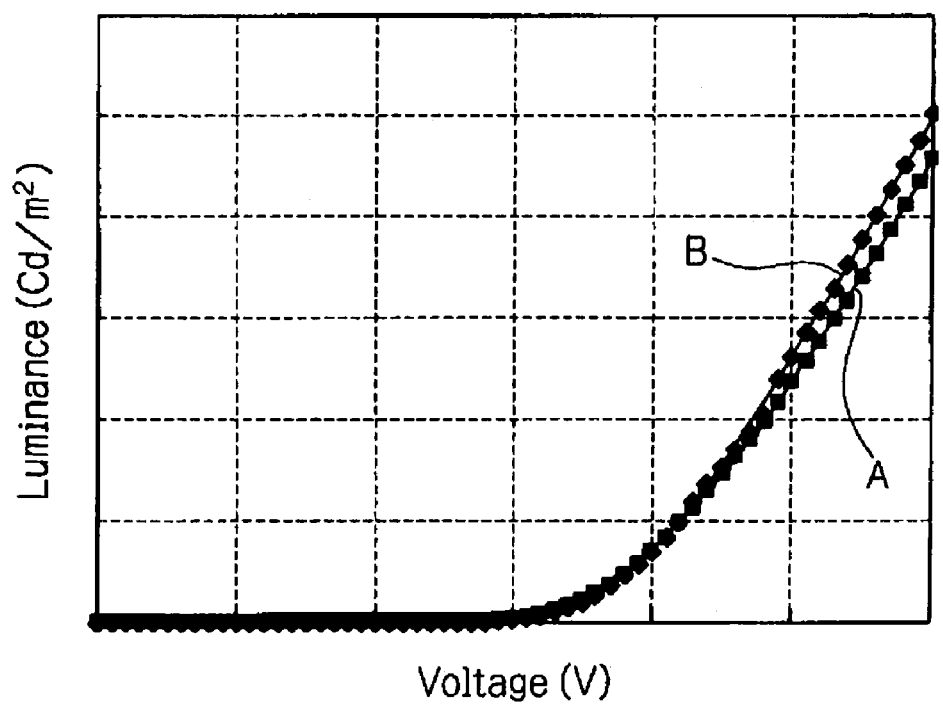

[Fig. 11]
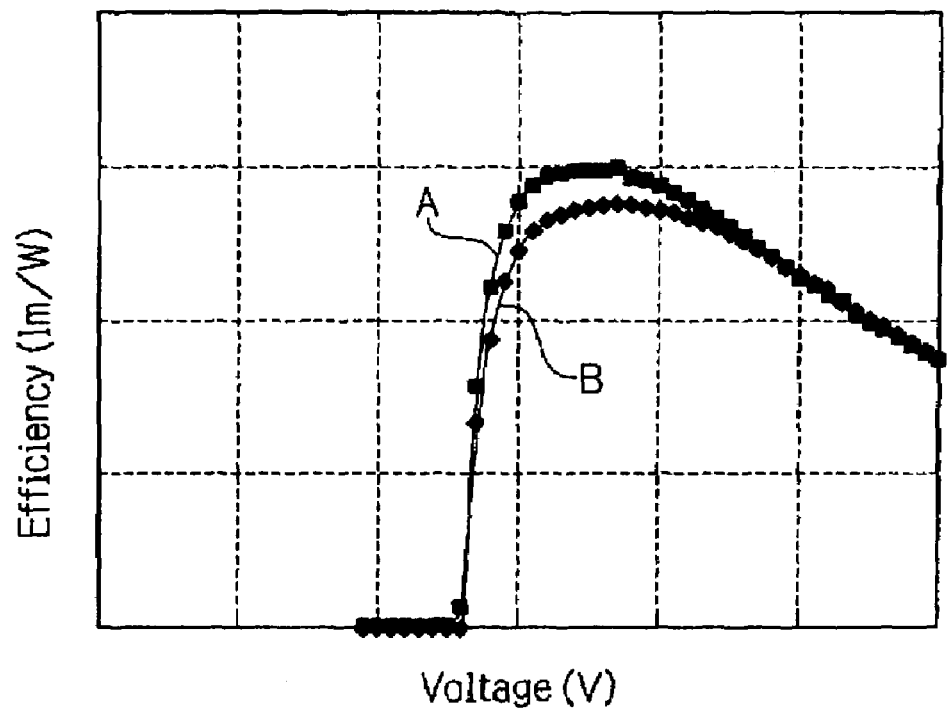
[Fig. 12]
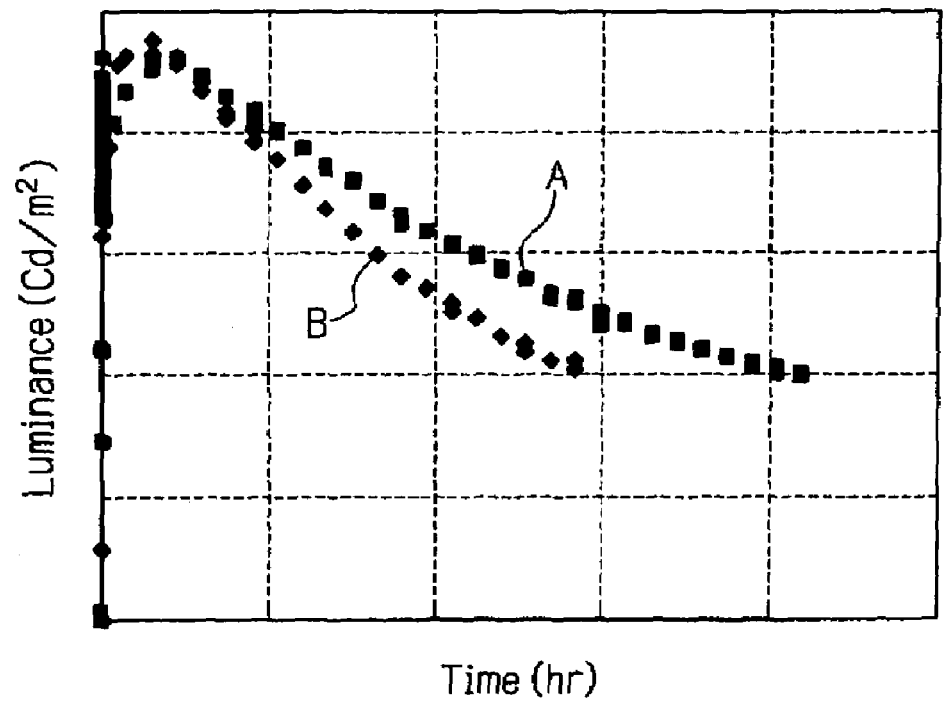

[Fig. 13]
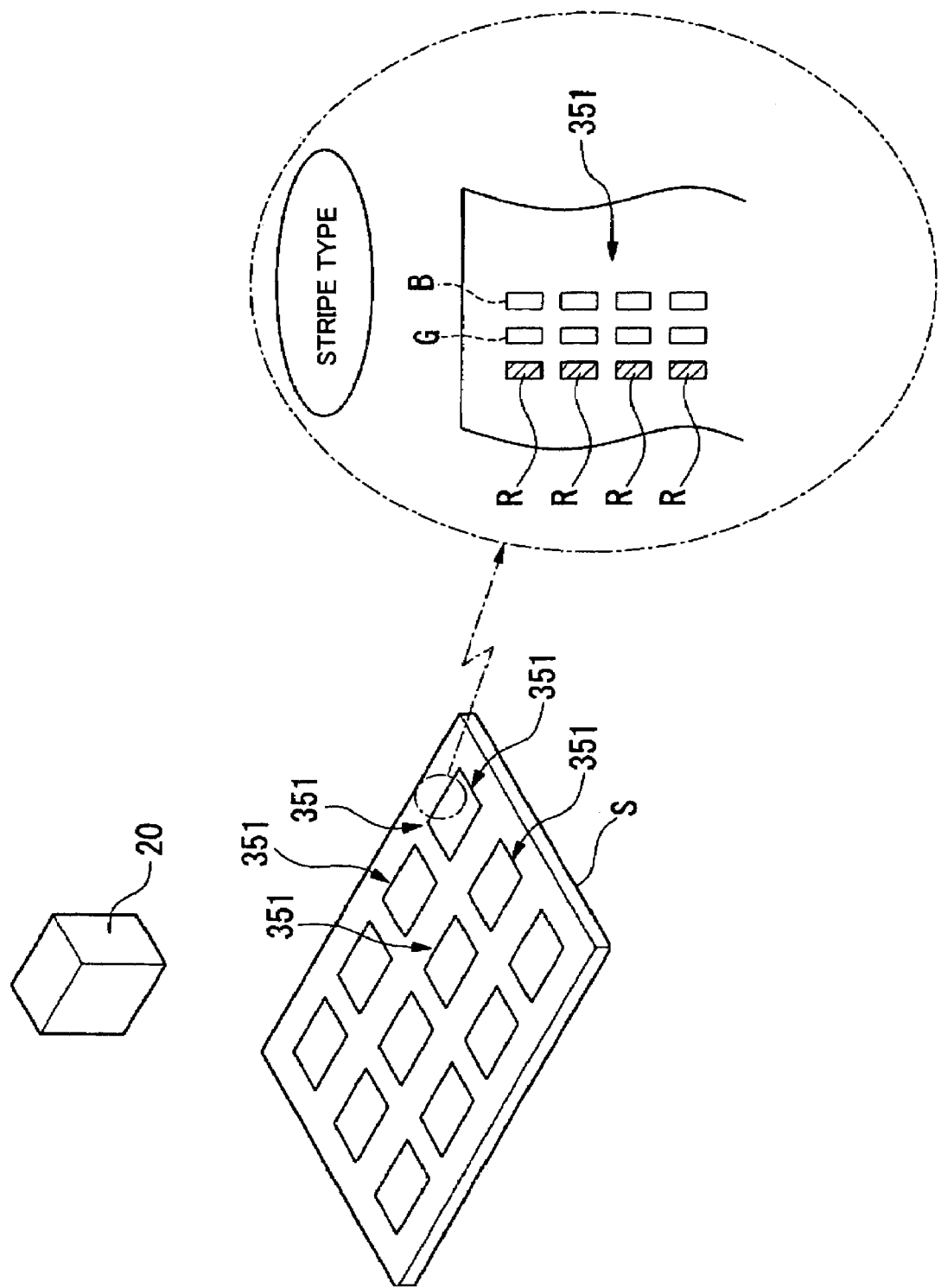

[Fig. 14]
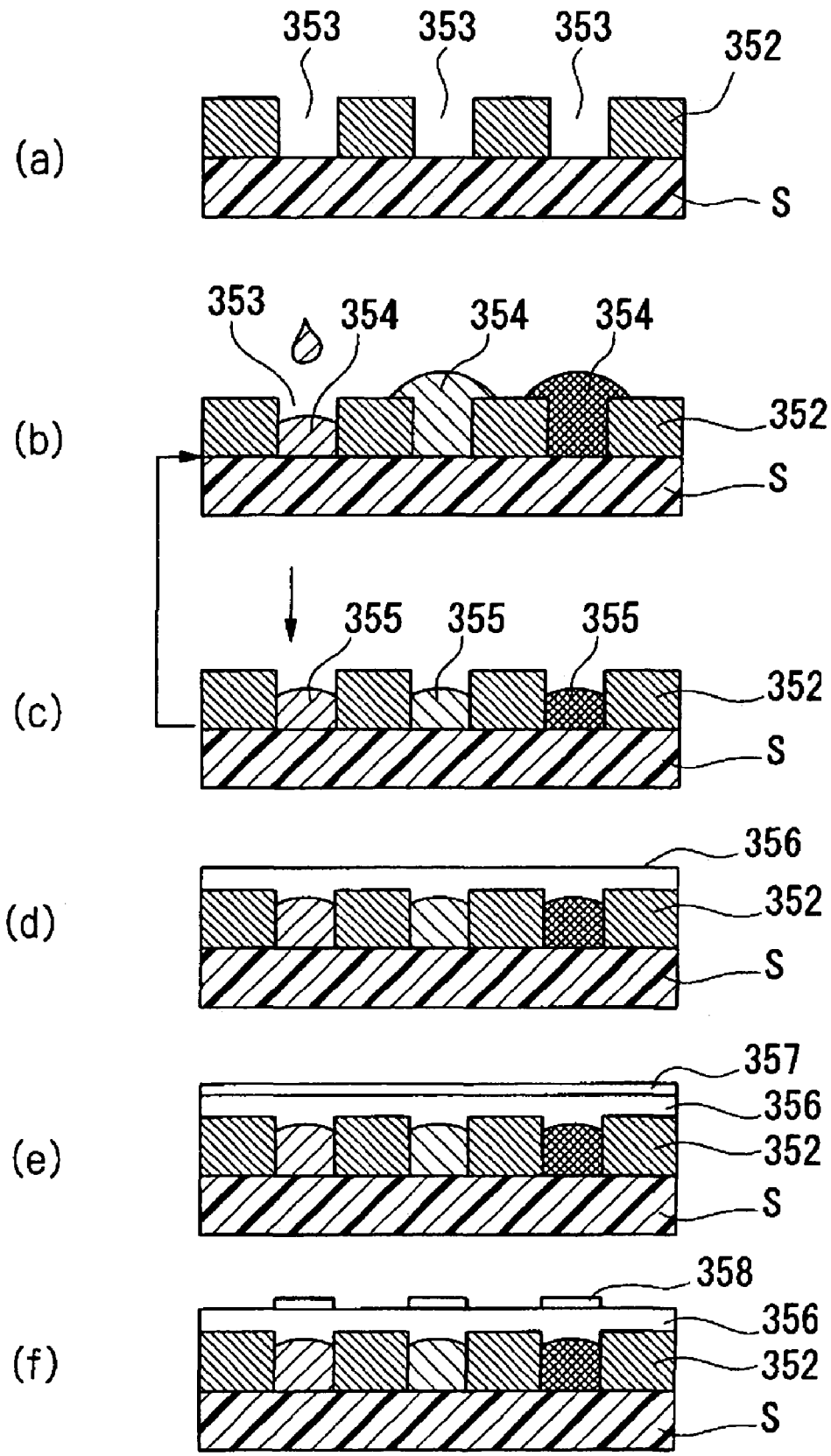

[Fig. 15]
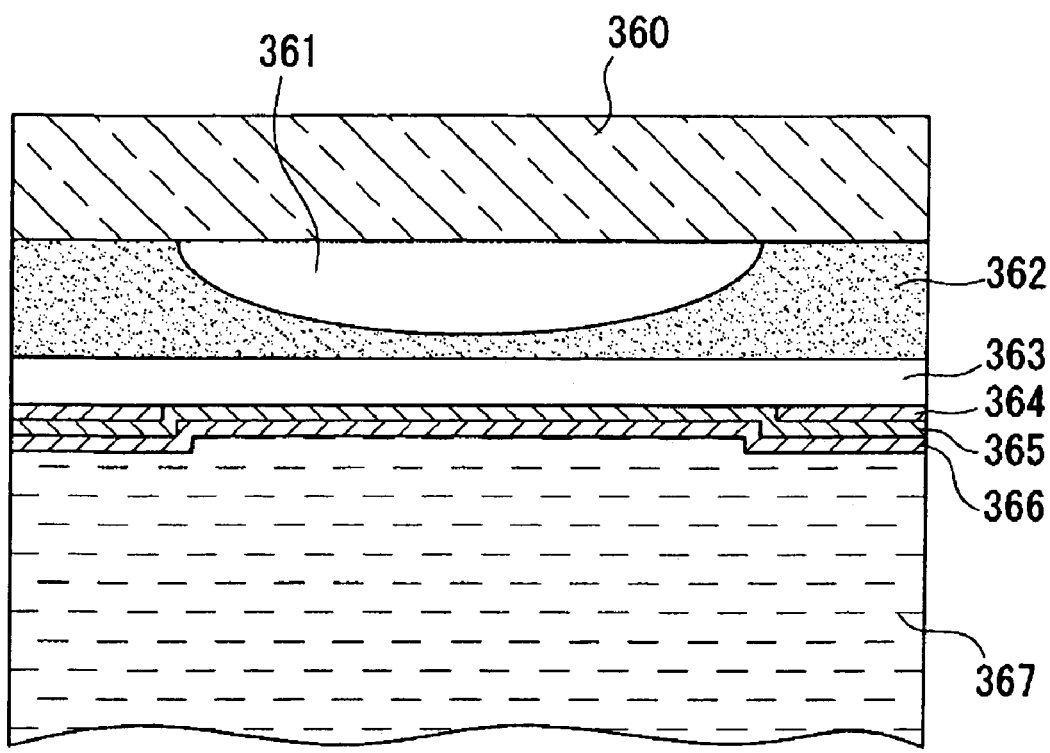
[Fig. 16]
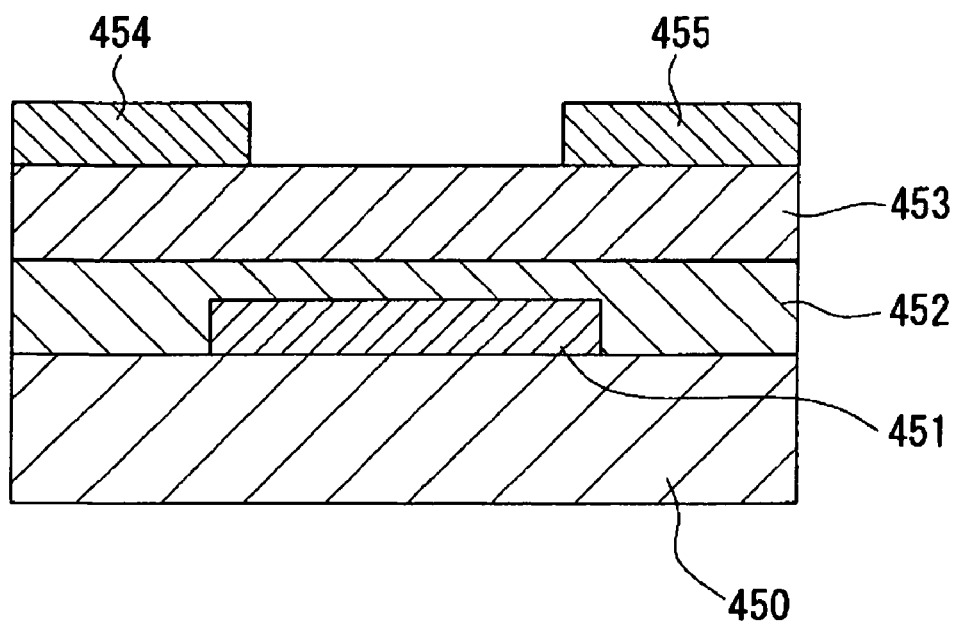

[Fig. 17]
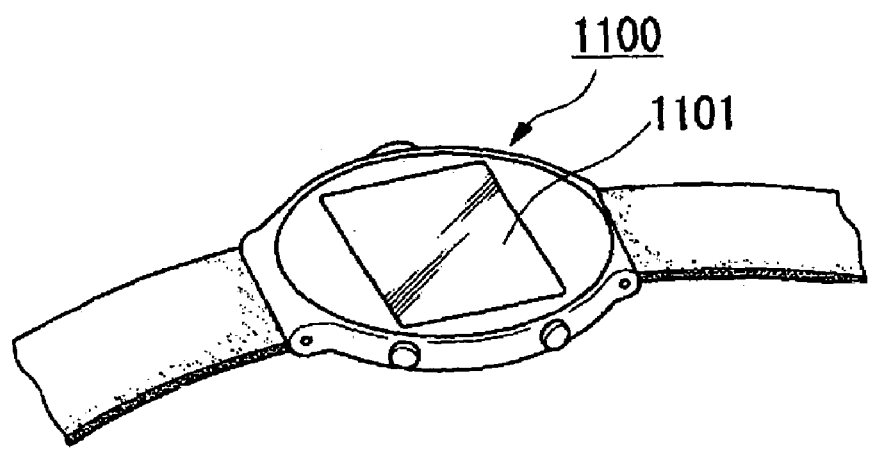
[Fig. 18]
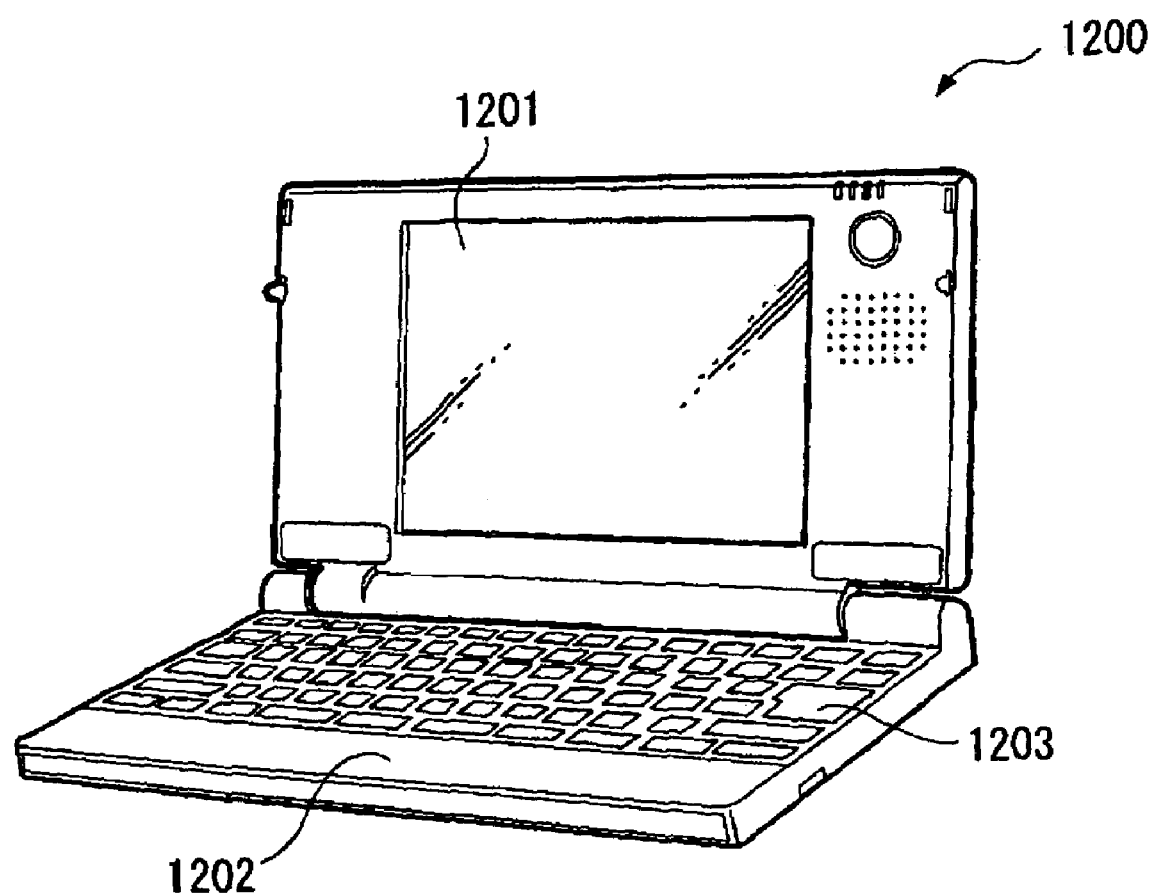

[Fig. 19]
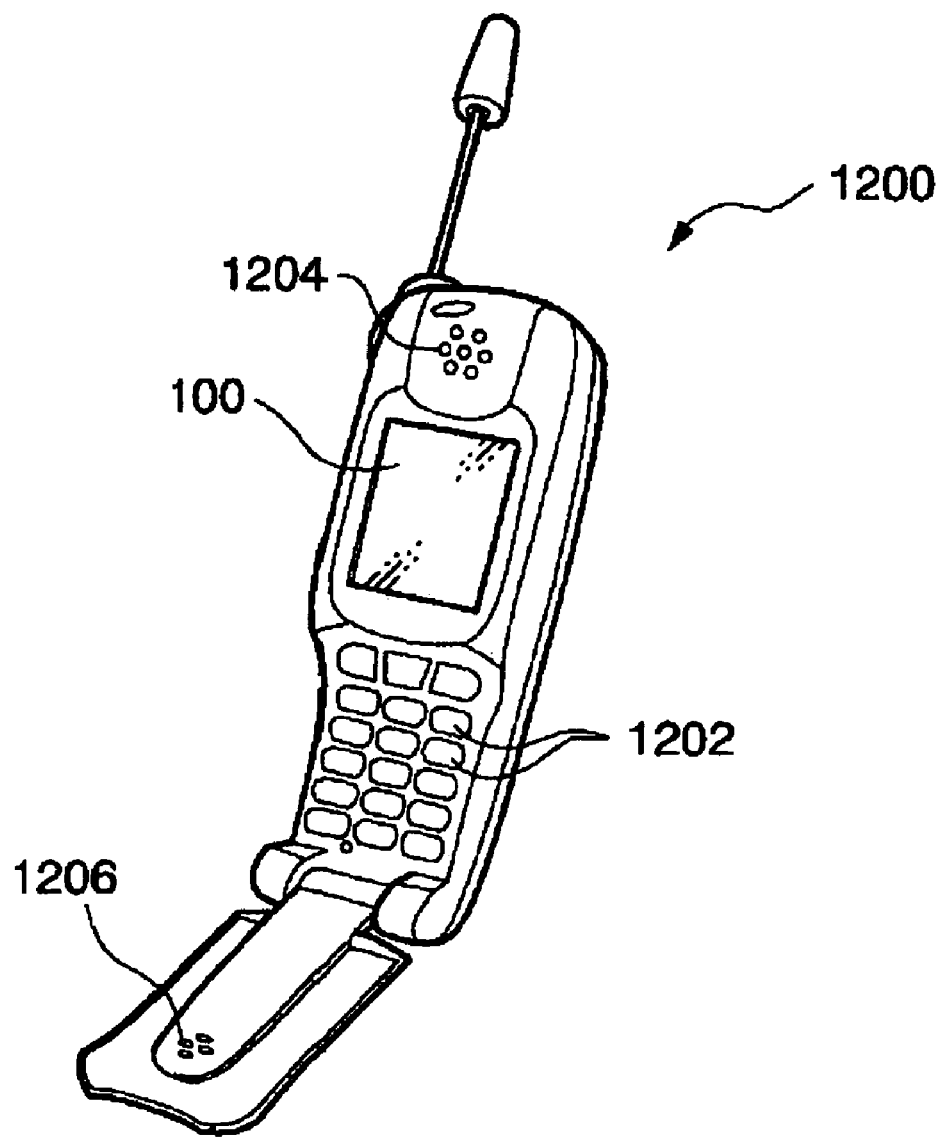

[Fig. 20]
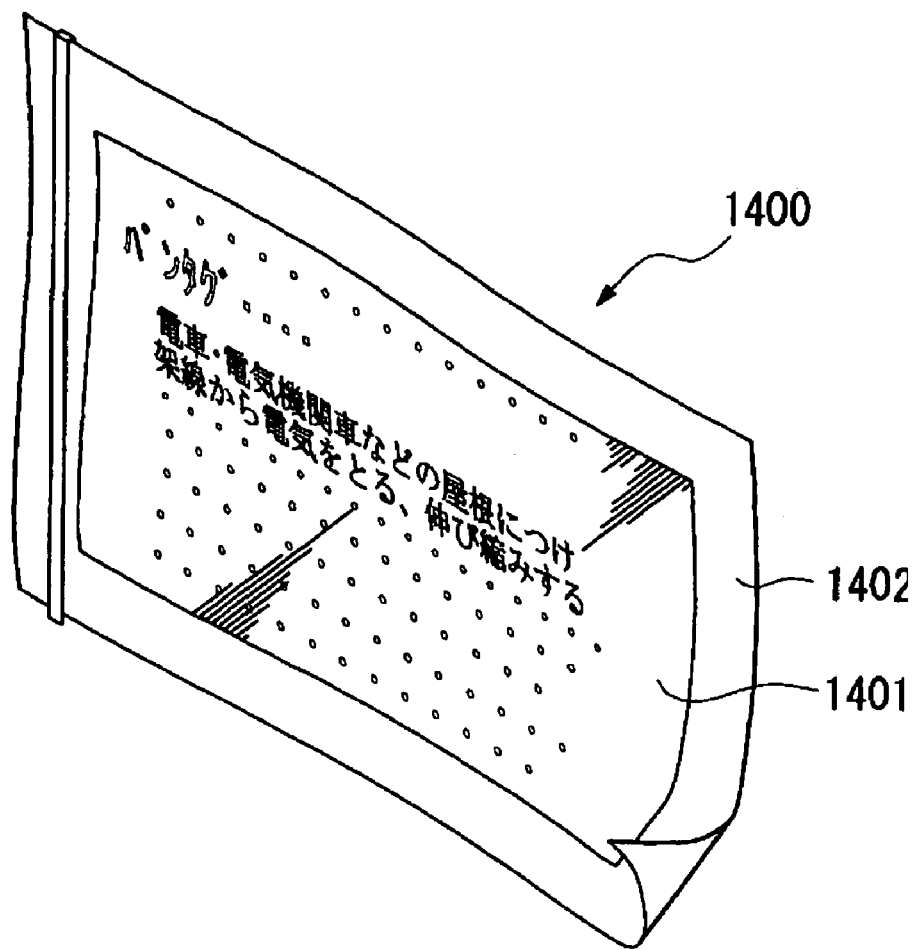
[Fig. 21]
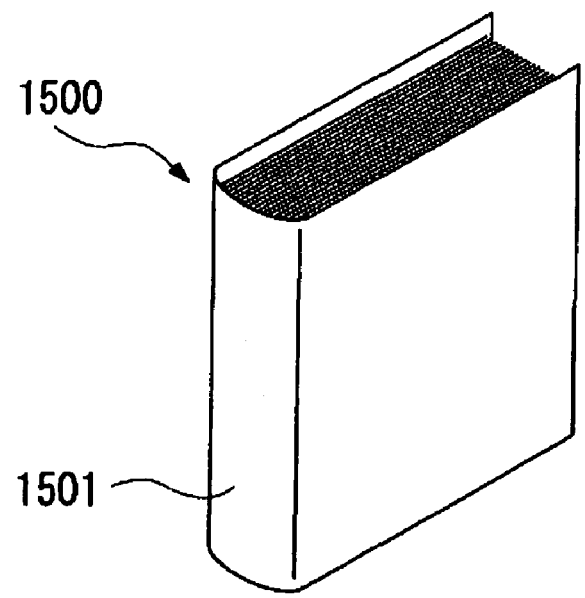

[Fig. 22]
(a)
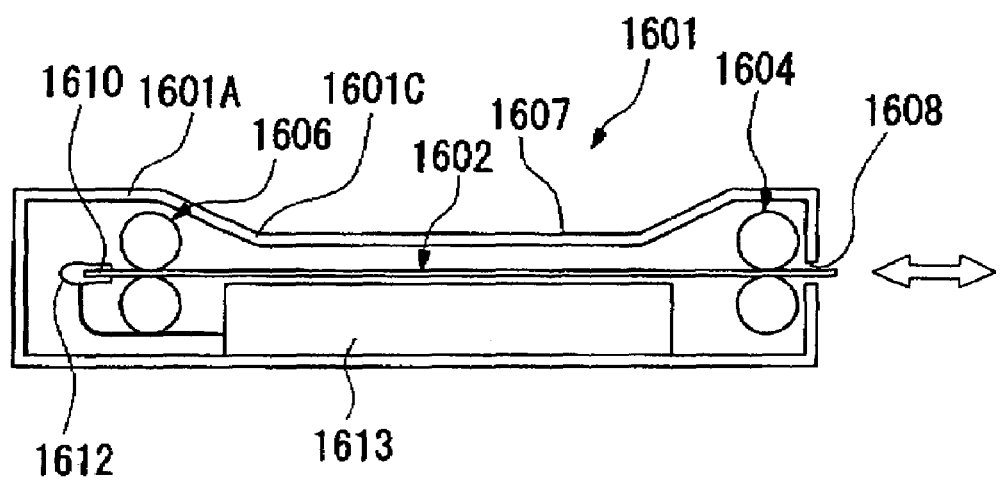
(b)
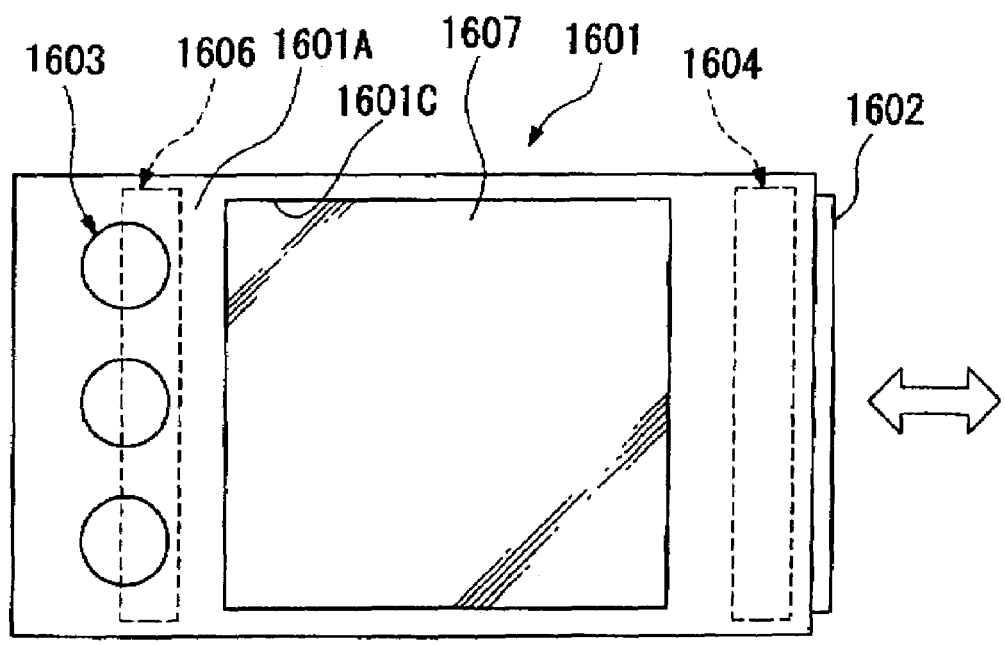

COMPOSITION, METHOD OF FORMING FILM, FILM FORMATION DEVICE, ELECTRO-OPTICAL DEVICE, METHOD OF MANUFACTURING THE SAME, ORGANIC ELECTROLUMINESCENT DEVICE, METHOD OF MANUFACTURING THE SAME, DEVICE AND METHOD OF MANUFACTURING THE SAME, AND ELECTRONIC APPARATUS

BACKGROUND OF THE INVENTION

1. Technical Field of the Invention

The present invention relates to a composition, a method of forming a film, a film formation device, an electro-optical device, a method of manufacturing the electro-optical device, an organic electroluminescent device, a method of manufacturing the organic electroluminescent device, a device, a method of manufacturing the device, and a electronic apparatus.

2. Description of the Related Art

Conventionally, photolithographic methods have been mainly used to form fine patterns such as wire patterns in semiconductor devices, but recently, much attention has been paid to a pattern formation method using a liquid droplet ejecting method (a liquid material ejecting method). The liquid droplet ejecting method is a method in which a pattern forming material is subject to liquidization (that is, ink formation) by a solvent, and the liquid droplets (ink droplets) are ejected on a base substrate with a liquid droplet ejecting device (liquid material ejecting device), thereby forming the pattern. The liquid droplet ejecting method is a very effective method in that it can be applied to small quantity batch production.

However, the aforementioned pattern formation method has problems, as follows.

In case that there are bubbles in a liquid material composition (ink), flight curvatures of the liquid droplets sometimes occur when the liquid droplets are ejected from the liquid droplet ejecting device. If the flight curvatures of the liquid droplets occur, the liquid droplets may not be disposed at the desired positions on the base substrate, so that the accuracy of the formed patterns may be deteriorated.

Further, when film patterns are formed on the base substrate by using the liquid material composition, if wettability of the liquid material composition over the base substrate is not good, the film cannot be formed in a uniform thickness.

Further, if there are the bubbles in the liquid material composition at the time of the film formation, there is another problem that the surface of the film may not be formed smoothly due to the bubbles.

The object of the present invention made in consideration of the above problems is to provide a composition by which it is possible to manufacture a film having a uniform thickness with enhancing wettability over a base substrate when a film is formed by using a composition containing a liquid material and at the same time to enhance the stability of ejection without the flight curvatures being occurred when the composition is disposed on the base substrate with a liquid droplet ejecting method (a liquid material ejecting method).

Further, the another object of the present invention is to provide a film formation method and a film formation device with which it is possible to form a film pattern in good productivity by using the composition.

Further, the another object of the present invention is to provide an electro-optical device having high reliability by using the composition, a method of manufacturing the electro-optical device, an organic electroluminescent device, a method of manufacturing the organic electroluminescent device, a device, a method of manufacturing the device, and a electronic apparatus in which these devices are mounted.

SUMMARY OF THE INVENTION

In order to solve the above problems, the composition according to the present invention is characterized in that a surfactant is added to a solution containing an organic functional material and a solvent.

According the present invention, it is possible to suppress generation of bubbles in the composition by adding the surfactant to the solution containing the organic functional material and the solvent for liquidization (ink formation) thereof. Therefore, since the flight curvatures of the liquid droplets made of the composition cannot occur when the liquid droplets are ejected from a liquid material ejecting device (a liquid droplet ejecting device), it is possible to dispose the liquid droplets at the desired positions on the base substrate. Further, since the wettability of the composition over the base substrate can be enhanced by adding the surfactant, it is possible to obtain a uniform thickness of the film formed on the base substrate. Further, since the generation of the bubbles can be suppressed by the surfactant even after the film is formed on the base substrate with the composition, it is possible to form the surface of the film smoothly.

Here, the used solvent may be appropriately selected from any solvents of organic system solvents, water system solvents, etc., in accordance with the physical properties of the organic functional materials. Further, an addition agent for suppressing the generation of the bubbles in the composition may be include a dispersing agent, an antifoaming agent, a pH controlling agent, etc. besides a surfactant and these addition agents may be added to the composition in place of the surfactant or with the surfactant.

In the composition according to the present invention, the surfactant is transparent or semitransparent. By doing so, when the composition is applied to manufacture a light-emitting device, colorization due to the surfactant can be suppressed and the influence of the surfactant on light-emitting color such as changes of the light-emitting color, deterioration of luminance, etc. by the light-emitting device can be suppressed, so that it is possible to obtain desired chromogenic states. Further, when the added quantity of the surfactant over the organic functional material is sufficiently small, the influence on the light-emitting color may be weak even if the surfactant is colorized.

In the composition according to the present invention, the organic functional material is a light-emitting material. By doing so, when the light-emitting material is liquidized to manufacture an element, the generation of the bubbles can be suppressed and at the same time the wettability over the base substrate can be enhanced to form a film having a uniform thickness, so that the element can have good light-emitting performance.

Further, in the composition according to the present invention, the organic functional material is a polymer material or an organic electroluminescent material. Furthermore, when the organic functional material is the organic electroluminescent material, the material to which the surfactant is added may be a hole injecting material (a hole injecting layer formation material) or a light-emitting material (a light-emitting layer formation material).

In the composition according to the present invention, the hydrophilic-lipophilic balance (HLB value) of the surfactant is 1 or more and 20 or less. By doing so, the generation of the bubbles can be suppressed and at the same time the wettability over the base substrate can be enhanced.

Here, when the organic functional material is an organic electroluminescent material and the used solvent is a water system solvent, the HLB value of the surfactant is preferably 4 to 20, and more preferably 6 to 16. Further, when the used solvent is an organic system solvent, the HLB value of the surfactant is preferably 1 to 16, and more preferably 3 to 12.

Furthermore, in the composition according to the present invention, the concentration of the surfactant in the composition (solution) is preferably 0.01 to 5.0 wt % and more preferably 0.05 to 0.5 wt %.

The method of forming a film according to the present invention is characterized in that the method comprises the step of applying a liquid material containing an organic functional material and a solvent to which a surfactant is added on a predetermined surface, thereby forming a film.

In the method of forming a film according to the present invention, since the surfactant is added to the composition, it is possible to suppress the generation of the bubbles and at the same time to enhance the wettability over the base substrate. Therefore, it is possible to manufacture a good film.

In the method of forming a film according to the present invention, the organic functional material is preferably a light-emitting material. By doing so, it is possible to manufacture a film having good light-emitting characteristics.

Further, in the method of forming a film according to the present invention, the organic functional material may be a component constituting material of an organic electroluminescent element, a component constituting material of a color filter, a component constituting material of an organic thin film transistor element, and a component constituting material of a liquid crystal element. By adding the surfactant to each of the component constituting materials, each of the elements can have good performance.

In the method of forming a film according to the present invention, the film is formed by ejecting a liquid material containing the composition onto a predetermined surface with a liquid material ejecting device. That is, the film may be formed by ejecting a composition according to the present invention onto the predetermined surface with a liquid material ejecting method (a liquid droplet ejecting method). In this case, since the surfactant is added to the composition, the flight curvatures cannot occur and the ejecting operation of the liquid material ejecting device can be stabilized, so that it is possible to form desired film patterns. Further, the method of forming a film by using the composition according to the present invention is not limited to the liquid material ejecting method but it may employ a spin coating method or other coating methods (film formation methods).

The film formation device according to the present invention is characterized in that the apparatus comprises liquid material regulating means for regulating a liquid material composition containing an organic functional material, a solvent, and a surfactant; and liquid material ejecting means for ejecting the liquid material regulated by the liquid material regulating means onto a predetermined surface.

According to the present invention, since the surfactant is added to the composition, the generation of the bubbles in the composition can be suppressed and at the same time the wettability over the base substrate can be enhanced. Therefore, it is possible to manufacture a film having a uniform thickness in good productivity. Further, since the film is formed by using the liquid material ejecting means (ejecting device), it is possible to easily form any film patterns.

In the film formation device according to the present invention, the apparatus comprises transporting means for transporting the liquid material between the regulating means and the liquid material ejecting means. Here, it is preferable that the transporting means is shielded from an external atmosphere.

The film formation device according to the present invention is characterized in that the apparatus comprises liquid material composition regulating device for regulating a composition containing an organic electroluminescent material, a solvent, and a surfactant; and film forming unit for applying the composition regulated by the regulating device on a predetermined surface, thereby forming a film.

According to the present invention, since the surfactant is added to the composition containing the organic electroluminescent material, the generation of the bubbles in the composition can be suppressed and at the same time the wettability over the base substrate can be enhanced. Therefore, it is possible to manufacture films having a uniform thickness in good productivity and it is possible to manufacture organic electroluminescent elements having desired performance.

In the film formation device according to the present invention, the apparatus preferably comprises a stage device for supporting a base substrate having the predetermined surface and also being movable. By doing so, since the composition is laid on the predetermined surface while the stage device being moved, it is possible to efficiently manufacture the film.

The electro-optical device according to the present invention is characterized in that in the electro-optical device having a functional element, the functional element contains a surfactant.

According to the present invention, since the surfactant is contained in the functional element, it is possible to suppress the generation of the bubbles in the material in the functional element at the time of manufacturing the element, and thus it is possible to provide an electro-optical device having high performance.

In the electro-optical device according to present invention, the functional element is a light-emitting element. That is, the functional element may be constructed by a material layer which is able to emit light. By doing so, it is possible to provide an electro-optical device having good light-emitting performance.

Further, in the aforementioned electro-optical device, the light-emitting element comprises a light-emitting layer and a pair of electrodes which sandwich the light-emitting layer therebetween, and the electro-optical device comprises a base substrate for supporting the light-emitting element and a current passage controlling unit disposed on the, base substrate for controlling current passage to the electrodes. By doing so, it is possible to supply desired power to the light-emitting layer through the electrodes with the current passage controlling unit, thereby emitting light.

Further, the electro-optical device according to the present invention, the functional element may be constructed to be an organic electroluminescent element.

The method of manufacturing an electro-optical device according to the present invention is characterized in that in the method of manufacturing an electro-optical device having functional elements, the method comprises process of adding a surfactant to a liquid material containing a functional element constituting material and a solvent, thereby regulating a composition, and process of sending the composition to liquid material ejecting means through a passage, and applying the composition on the base substrate with the liquid material ejecting means, thereby forming a film which will become components of the functional elements.

According to the present invention, since the composition is made of the functional element constituting material, the solvent, and the surfactant, it is possible to suppress the generation of the bubbles at the time of manufacturing the composition or preserving the composition.

Further, since the film is formed by using the composition, the bubbles cannot occur even at the time of forming the film, so that it is possible to manufacture a film having good smoothness.

Further, the functional element may be constructed to be an organic electroluminescent element.

The organic electroluminescent device according to the present invention is characterized in that in the organic electroluminescent device having a plurality of material layers, at least one material layer of the plurality of the material layers contains a surfactant.

According to the present invention, since the surfactant is contained in a material layer constituting the organic electroluminescent device, it is possible to form the material layer having good smoothness and uniform thickness. Therefore, it is possible to provide an organic electroluminescent device having high reliability.

In this case, a light-emitting layer of the material layers constituting the organic electroluminescent device contains a surfactant is employed. By doing so, since the light-emitting layer having good smoothness and uniform thickness is formed, it is possible to provide an organic electroluminescent device having good light-emitting characteristics.

The method of manufacturing an organic electroluminescent device according to the present invention is characterized in that in the method of manufacturing an organic electroluminescent device having a plurality of material layers, the method comprises step of adding a surfactant to a solution containing a material layer forming material and a solvent, thereby regulating a composition, and using the composition, thereby forming the material layers.

According to the present invention, since the surfactant is added to the material layer forming material when the composition is manufactured in order to manufacture the organic electroluminescent device, it is possible to suppress the generation of the bubbles in the composition at the time of manufacturing the composition or preserving the composition. Further, by using the composition to form the material layers, the material layers having good smoothness and uniform thickness are formed. Therefore, it is possible to manufacture an organic electroluminescent device having high reliability.

In the method of manufacturing the organic electroluminescent device according to the present invention, the material layers are formed by ejecting liquid material containing the composition with a liquid material ejecting device is employed. By doing so, it is possible to form the material layers having good workability with simple construction without generation of the flight curvatures.

The device according to the present invention is characterized in that the device is manufactured by using the aforementioned composition. Further, the method of manufacturing the device according to the present invention is characterized in that the method comprises step of using the aforementioned composition. Further, in the method of manufacturing the device according to the present invention, the construction that the method comprises process of ejecting a liquid droplet made of the composition with liquid droplet ejecting device is employed. By doing so, it is possible to provide a device having high reliability.

The electronic apparatus according to the present invention is characterized in that the apparatus is provided with the aforementioned electro-optical device. Further, the electronic apparatus according to the present invention is characterized in that the apparatus is provided with the aforementioned organic electroluminescent device. By doing so, it is possible to provide an electronic apparatus having good characteristics.

Here, the liquid material ejecting device (liquid droplet ejecting device) in the present invention includes an inkjet device including inkjet head (liquid droplet ejecting head). The inkjet head of the inkjet device can quantitatively eject the composition with an inkjet method, and for example, is a device which can quantitatively and intermittently drop the composition of 1 to 300 ng per one dot. Further, the liquid droplet ejecting device may be a dispenser device.

The liquid droplet ejecting type of the liquid droplet ejecting device may be a piezo-jet type for ejecting the composition of the liquid material in accordance with change in volume of a piezoelectric element or a type for ejecting the composition by rapidly generating vapor with applying heat.

A composition (liquid material composition) containing a liquid material denotes a medium having such viscosity that liquid droplets can be ejected (dropped) from the nozzles of the ejecting head of the liquid droplet ejecting device. The composition may be a water system one or an oil system one. It is sufficient that the composition has fluidity (viscosity) to be ejected from the nozzles and the like and that the composition is wholly a fluid material even though some solid materials are mixed therein. Further, it is sufficient that the material contained in the composition may be one dissolved by heating above its melting point, one stirred as particles in a solvent, or one added by a dye, a pigment or other functional material besides the solvent. Furthermore, the base substrate may be a curved-surface shaped substrate besides a flat substrate. Further, the pattern formation surface unnecessarily has high hardness and may have glass, plastic, metal, or one having flexibility such as film, paper, rubber, etc.

BRIEF DESCRIPTION OF THE DRAWINGS

FIG. 1 is a schematic constructional view illustrating one embodiment of a film formation device according to the present invention.

FIG. 2 is a view illustrating a liquid droplet ejecting head.

FIG. 3 is a view illustrating a liquid droplet ejecting head.

FIG. 4 is a circuit diagram illustrating an organic EL device.

FIG. 5 is a view for describing a portion corresponding to one pixel of an organic EL device.

FIGS. 6(a)–6(e) are views illustrating one example of a process of manufacturing the organic EL device.

FIGS. 7(a)–7(c) are views illustrating one example of a process of manufacturing the organic EL device.

FIGS. 8(a)–8(c) are views illustrating one example of a process of manufacturing the organic EL device.

FIG. 9 is a view illustrating a result of a characteristic test of an organic EL device according to the present invention and a conventional organic EL device.

FIG. 10 is a view illustrating a result of a characteristic test of an organic EL device according to the present invention and a conventional organic EL device.

FIG. 11 is a view illustrating a result of a characteristic test of an organic EL device according to the present invention and a conventional organic EL device.

FIG. 12 is a view illustrating a result of a characteristic test of an organic EL device according to the present invention and a conventional organic EL device.

FIG. 13 is a view illustrating a color filter.

FIGS. 14(a)–14(f) are views illustrating one example of a process of manufacturing the color filter.

FIG. 15 is a view illustrating a liquid crystal device.

FIG. 16 is a view illustrating an organic TFT element.

FIG. 17 is a view illustrating an electronic apparatus provided with an electro-optical device according to the present invention.

FIG. 18 is a view illustrating an electronic apparatus provided with an electro-optical device according to the present invention.

FIG. 19 is a view illustrating an electronic apparatus provided with an electro-optical device according to the present invention.

FIG. 20 is a view illustrating an electronic apparatus provided with an electro-optical device according to the present invention.

FIG. 21 is a view illustrating an electronic apparatus provided with an electro-optical device according to the present invention.

FIGS. 22(a)–22(b) are views illustrating an electronic apparatus provided with an electro-optical device according to the present invention.

DESCRIPTION OF THE PREFERRED EMBODIMENTS

Now, the film formation device according to the present invention will be described with reference to the drawings. FIG. 1 is a schematic constructional perspective view illustrating a liquid droplet ejecting device (film formation device) as a film formation device according to the present invention. Further, FIGS. 2 and 3 are views illustrating liquid droplet ejecting heads provided to the liquid droplet ejecting device.

In FIG. 1, the liquid droplet ejecting device IJ is a film formation device for applying a composition on a surface (a predetermined surface) of a substrate (base substrate) P and comprises a base 12, a stage (stage device) ST disposed on the base 12 for supporting the substrate P, a first moving unit 14 interposed between the base 12 and the stage ST for supporting the stage ST in a movable manner, a liquid droplet ejecting head 20 for quantitatively ejecting (dropping) the liquid material composition containing an organic functional material over the substrate P supported by the stage ST, and a second moving unit 16 for supporting the liquid droplet ejecting head 20 in a movable manner. The operations of the liquid droplet ejecting device IJ including the ejecting operation of the liquid material composition of the liquid droplet ejecting head 20 or the moving operations of the first moving unit 14 and the second moving unit 16 are controlled by a control unit CONT.

The first moving unit 14 is disposed on the base 12 and its position is determined along with the direction of the Y axis. The second moving unit 16 is attached to stand on the base 12 though pillars 16A, 16A and it is also attached in the rear portion 12A of the base 12. The direction of the X axis of the second moving unit 16 is perpendicular to the direction of the Y axis of the first moving unit 14. Here, the direction of the Y axis is a direction along with the directions of the front portion 12B and the rear portion 12A of the base 12. On the other hand, the direction of the X axis is a direction along with the right and left directions of the base 12, and each of the directions is horizontal. Further, the direction of the Z axis is perpendicular to the direction of the X axis and the direction of the Y axis.

The first moving unit 14 is constructed with, for example, a linear motor and comprises guide rails 40, 40 and a slider 42 which is disposed along the guide rails 40 in a movable manner. The slider 42 of the first moving unit 14 having type of the linear motor moves along the guide rails 40 in the direction of the Y axis to make determination of positions.

Further, the slider 42 comprises a motor 44 for the Z axis rotation (θz). The motor 44 is, for example, a direct drive motor and the rotor of the motor 44 is fixed on the stage ST. By doing so, when the motor 44 is energized, the rotor and the stage ST are rotated along the θz direction, thereby indexing (rotation-dividing) the stage ST. In other words, the first moving unit 14 can move the stage ST in the direction of the Y axis and the θz direction.

The stage ST supports the substrate P, thereby make determination of its positions to be predetermined positions. Further, the stage ST comprises a sucking holing unit 50 and when the sucking holding unit 50 is driven, the holes 46A of the stage ST are passed through, thereby sucking and holding the substrate P on the stage ST.

The second moving unit 16 is constructed with a linear motor and comprises columns 16B fixed on the pillars 16A, 16A, guide rails 62A which is supported in the columns 16B, and a slider 60 which is supported in a movable manner in the direction of the X axis along the guide rails 62A. The slider 60 moves along the guide rails 62A in the direction of the X axis to make determination of positions and the liquid droplet ejecting head 20 is attached on the slider 60.

The liquid droplet ejecting head 20 comprises motors 62, 64, 66, and 68 as a fluctuating position determination device. When the motor 62 is driven, the liquid droplet ejecting head 20 moves upward-downward along with the Z axis, thereby making determination of positions. The Z axis is a direction (upward-downward direction) perpendicular to each of the X axis and Y axis. When the motor 64 is driven, the liquid droplet ejecting head 20 is fluctuated along the β direction of the rotation of the Y axis, thereby making determination of positions. When the motor 66 is driven, the liquid droplet ejecting head 20 is fluctuated along the y direction of the rotation of the X axis, thereby making determination of positions.

When the motor 68 is driven, the liquid droplet ejecting head 20 is fluctuated along the α direction of the rotation of the Z axis, thereby making determination of positions. In other words, the second moving unit 16 supports the liquid droplet ejecting head 20 in a movable manner in the direction of the X axis and the direction of the Y axis and at the same time, it supports the liquid droplet ejecting head 20 in a movable manner along the θx direction, θy direction, and θz direction.

In this manner, the liquid droplet ejecting head 20 in FIG. 1 carries out rectilinear movement in the direction of the Z axis on the slider 60, thereby making determination of position and is fluctuated along the α, β and γ, thereby making determination of positions, and the ejecting surface 20P of the liquid droplet ejecting head 20 can accurately control its position and posture over the substrate P of the stage ST. Further, the ejecting surface 20P of the liquid droplet ejecting head 20 is provided with a plurality of nozzles for ejecting the liquid material composition.

FIG. 2 is a disassembled perspective view illustrating the liquid droplet ejecting head 20. As shown in FIG. 2, the liquid droplet ejecting head 20 comprises a nozzle plate 80 having nozzles 81, a pressure chamber substrate 90 having a vibrating plate 85, and a chasing 88 for interposing and supporting the nozzle plate 80 and the vibrating plate 85. The principal structure of the liquid droplet ejecting head 20 is a structure that the pressure chamber substrate 90 is interposed between the nozzle plate 80 and the vibrating plate 85, as shown in the partial cross sectional perspective view of FIG. 3. The nozzle plate 80 is provided with nozzles 81 at positions corresponding to cavities 81 (pressure chambers) when it is attached to the pressure chamber substrate 90. The pressure chamber substrate 90 is provided with a plurality of the cavities 81 for serving as pressure chambers by etching silicon single crystal substrate, etc. The cavities 81 are separated one another by a side wall 92 therebetween. Each of cavities 81 is connected to reservoir 93 which is a common flow passage through a supply inlet 94. The vibrating plate 85 is made of, for example, thermal oxide film, etc. A tank inlet 86 is disposed on the vibrating plate 85 and constructed to pass a pipe 31 (passage) from a tank 30 as a liquid material composition generating device S described below, thereby supplying any liquid material composition. Piezoelectric elements 87 are formed at positions corresponding to the cavities 81 on the vibrating plate 85. The piezoelectric elements 87 have the construction that crystals of piezoelectric ceramics such as PZT elements, etc., are interposed between an upper electrode and a lower electrode (not shown). The piezoelectric elements 87 are constructed to generate changes of their volumes in accordance with the ejecting signals supplied from the control unit CONT.

In order to eject the liquid material composition from the liquid droplet ejecting head 20, the control unit CONT first supplies the ejecting signals for ejecting the liquid material composition to the liquid droplet ejecting head 20. The liquid material composition flows into the cavities 81 of the liquid droplet ejecting head 20, and in the liquid droplet ejecting head 20 supplied with the ejecting signals, the piezoelectric elements 87 generate changes of their volumes in accordance with the voltages applied between the upper electrode and the lower electrode. The changes of the volumes enable the vibrating plate 85 to be deformed, thereby changing the volumes of the cavities 81. As a result, the liquid droplets of the liquid material composition are ejected from the nozzle openings 211 of the cavities 81. In the cavities 81 which has ejected the liquid material composition, new liquid material composition is supplied by the reduced quantity due to the ejecting from the tank 30, described below.

Further, the aforementioned liquid droplet ejecting head has the construction that the generation of volume changes in piezoelectric elements enables the liquid material composition to be ejected, but it may have the head construction that the heating of a liquid material with a heating element enables the liquid material to be expanded, thereby ejecting the liquid droplets.

Returning to FIG. 1, the liquid material composition disposed on the substrate P is generated by the liquid material composition generating device S. The liquid material composition generating device S comprises the tank 30 for accommodating the liquid material composition, a temperature regulating unit 32 to be attached to the tank 30 for regulating the temperature of the liquid material composition accommodated in the tank 30, and a stirring unit 33 for stirring the liquid material composition accommodated in the tank 30. The temperature regulating unit 32 comprises a heater and adjusts the temperature of the liquid material composition in the tank 30 to any temperature.

In the present embodiment, the liquid material composition generating device S generates the liquid material composition by adding a surfactant to a solution containing an organic functional material and a solvent. The tank 30 is connected to an organic functional material supplying unit 1 for supplying a predetermined organic functional material to the tank 30, a solvent supplying unit 2 for supplying a predetermined solvent to the tank 30, and a surfactant supplying unit 3 for supplying a predetermined surfactant. Further, the organic functional material, the solvent and the surfactant supplied from each of the supplying units to the tank 30 are stirred with the stirring unit 33, thereby generating a liquid material composition containing the organic functional material, the solvent and the surfactant. Materials contained in the liquid material composition are stirred with the stirring unit 33, thereby being uniformly dispersed. Here, the temperature regulating unit 32 is controlled by the control unit CONT and the temperature of the liquid material composition in the tank 30 is regulated by the temperature regulating unit 32, thereby being regulated in a desired viscosity.

The tank 30 is connected to the liquid droplet ejecting head 20 through the pipe 31 (passage), the liquid material composition which is ejected from the liquid droplet ejecting head 20 is supplied from the tank 30 through the pipe 31. Further, the temperature of the liquid material composition flowing in the pipe 31 is controlled at a predetermined temperature by the pipe temperature regulating unit (not shown), thereby regulating the viscosity. Further, the temperature of the liquid material composition which is ejected from the liquid droplet ejecting head 20 is controlled by the temperature regulating unit (not shown) disposed in the liquid droplet ejecting head 20, thereby regulating the viscosity to desired one.

Further, although the one liquid droplet ejecting head 20 and the one liquid material composition generating device S are shown in FIG. 1, a plurality of the liquid droplet ejecting heads 20 and a plurality of the liquid material composition generating devices S are disposed in the liquid droplet ejecting device IJ, and the heterogeneous or homogeneous liquid material composition is ejected from each of the plurality of the liquid droplet ejecting heads 20.

Furthermore, a first liquid material composition from the first liquid droplet ejecting head 20 out of the plurality of the liquid droplet ejecting heads 20 is ejected to the substrate P and then is sintered or dried, a second liquid material composition from the second liquid droplet ejecting head out of the plurality of the liquid droplet ejecting heads 20 is ejected to the substrate P and then is sintered or dried, and then similar processes are carried out by using the plurality of the liquid droplet ejecting heads, thereby laminating a plurality of material layers on the substrate P and then forming a multi layered pattern.

Next, the method of forming the film pattern on the substrate P by using the liquid material composition generated with the liquid material composition generating device S will be describe. From now on, the case that a film constituting an organic electroluminescent device (hereinafter, referred to as an organic EL device) is manufactured will be described as an example.

The present invention is characterized in that a liquid material composition in which a surfactant is added to a solution containing an organic functional material and a solvent is generated and a film is manufactured by using the liquid material composition. From now on, the case that the surfactant is added to each of the hole injecting layer and the light-emitting layer in the organic EL device will be described as an example. That is, the case that the surfactant is added to each of the hole injecting layer formation material (hole injecting material) and the light-emitting layer formation material (light-emitting material) as organic functional materials by using the aforementioned liquid material composition generating device S will be described as an example. Further, the sequence or material construction of the liquid material composition described below is only an example and is not limited to the below described ones.

FIGS. 4 and 5 are view for explaining the schematic construction of an example of an organic EL display 70 as an organic EL device, FIG. 4 is a circuit diagram, and FIG. 5 is a view illustrating the plane structure of each pixel 71, which is an enlarged plan view under the state of removing reflective electrodes or organic EL elements.

As shown in FIG. 4, the EL display 70 has the construction that since a plurality of scanning lines 131, a plurality of signal line 132 extending in the direction of intersecting the scanning lines 131, and a plurality of common feeding lines 133 extending parallel to the signal lines 132 are wired on the transparent substrate, respectively, the pixel (pixel region) 71 is provided to each of the intersections of the scanning lines 131 and the signal lines 132.

A data driving circuit 72 comprising shift registers, level shifters, video lines and analog switches is provided to the signal lines 132.

On the other hand, a scan driving circuit 73 comprising shift registers and level shifters are provided to the scanning lines 131. Further, in each pixel region 71, a switching thin film transistor (current passage controlling unit) 142 for supplying scanning signals to a gate electrode through the scanning lines 131, a holding capacitor cap for holding the image signals supplied from the signal lines 132 through the switching thin film transistor 142, a current thin film transistor 143 for supplying the image signals sustained by the holding capacitor cap to the gate electrode, a pixel electrode 141 to which driving current flow from the common feeding lines 133 when it is electrically connected to the common feeding lines 133 through the current thin film transistor 143, and a light-emitting portion 140 which is interposed between the pixel electrode 141 and the reflective electrode 154 is provided.

By this construction, when the scanning line 131 is driven to turn on the switching thin film transistor 142, the potential of the signal line 132 at this time is sustained to the holding capacitor cap, and the on/off state of the current thin film transistor 143 is determined in accordance with the state of the holding capacitor cap. Further, the current flows from the common feeding line 133 to the pixel electrode 141 through the channel of the current thin film transistor 143, in turn the current flows to the reflective electrode 154 through the light-emitting portion 140, and then the light-emitting portion 140 emits light in accordance with the quantity of the flowing current.

Here, as shown in FIG. 5, the plane structure of each pixel 71 is that the signal line 132, the common feeding line 133, the scanning line 131 and the scanning line for the other pixel electrode (not shown) are disposed around the four sides of the pixel electrode 141 having plane shape of a rectangle.

Next, the method of manufacturing the organic EL element constituting the EL display 70 will be described with reference to FIGS. 6 to 8. Further, the only single pixel 71 is shown in FIGS. 6 to 8 for simplicity of description.

First, the substrate P is prepared. Here, the organic EL element may have the construction that the light emitted by the light-emitting layer described below is output from the substrate side or the construction that the light is output from the site opposite to the substrate. In the case that the emitting light is output from the substrate side, a transparent material or a semitransparent material such as glass, quartz, or resin may be used for the material of the substrate and more particularly, the cheap glass is suitably used.

Further, a color filter film, a color conversion film containing a fluorescent material, or a dielectric reflective film may be disposed to the substrate, thereby controlling the color of the emitting light.

Furthermore, in the case that the emitting light is output from the side opposite to the substrate, the substrate may be opaque, and in this case, ceramics such as alumina, a metal sheet such as stainless steel of which surface is carried out by an insulation process such as a surface oxidation, a thermosetting resin, or a thermoplastic resin may be used.

In the embodiment of the present invention, the transparent substrate P made of glass, etc., as shown in FIG. 6(a) is used as the substrate. Further, an underlying protective film (not shown) made of silicon oxide film having thickness of about 200 to 500 nm by a plasma CVD method using TEOS (tetraethoxysilane) or oxygen gas as a source is formed over it if necessary.

Next, the temperature of the transparent substrate P is set to about 350° C., and a semiconductor film 200 made of an amorphous silicon film having thickness of about 30 to 70 nm is formed on the surface of the underlying protective film by the plasma CVD method. Subsequently, the crystallization process such as a laser annealing method or a solid phase growing method is carried out over the semiconductor film 200 and the semiconductor film 200 is crystallized into the polysilicon film. In the laser annealing method, line beam having beam length of 400 mm with an excimer laser, for example, is used, and the output intensity is, for example, 200 mJ/cm$^2$. In the line beam, the line beam is scanned to overlap each region by the portions corresponding to the 90% of the peak value of the intensity of the laser in the short direction.

Next, as shown in FIG. 6(b), the semiconductor film (polysilicon film) 200 is patterned to form a semiconductor film 210 having shape of island, and a gate insulating film 220 made of a silicon oxide film or nitride film having thickness of about 60 to 150 nm by the plasma CVD method using TEOS or oxygen gas as a source is formed on the surface. Further, as shown FIG. 5, the semiconductor film 210 is to be a channel region and source/drain regions of the current thin film transistor 143, but in the different cross section position thereof, a semiconductor film is also formed to be a channel region and source/drain regions of the switching thin film transistor 142. That is, although the two types of the thin film transistors 142, 143 are simultaneously manufactured in the manufacturing process shown in FIGS. 6 to 8, since they are manufactured by the same sequence, the below description of transistors will be made on the only the current thin film transistor 143 and the description of the switching thin film transistor 142 will be omitted.

Next, as shown in FIG. 6(c), after the conductive film made of a metal film such as aluminum, tantalum, molybdenum, titanium, or tungsten is formed by the sputtering method, the conductive film is patterned, and then the gate electrode 143A is formed.

Next, under this state, the phosphorus ion having a high concentration is injected and the source/drain regions 143a, 143b are formed in a self-aligned manner over the gate electrode 143A in the semiconductor film 210. Further, the portion which any impurities is not introduced becomes the channel region 143c.

Next, as shown in FIG. 6(d), after an interlayer insulating film 230 is formed, contact holes 232, 234 are formed and relay electrodes 236, 238 is buried in the contact holes 232, 234.

Next, as shown in FIG. 6(e), the signal lines 132, the common feeding lines 133 and the scanning lines (not shown in FIG. 6) are formed on the interlayer insulating film 230. Here, the relay electrode 238 and each wire may be formed in the same process. At that time, the relay electrode 236 is formed by the ITO film, described below.

Further, the interlayer insulating film 240 is formed to cover the top surface of each of the wires, the contact hole (not shown) is formed at the position corresponding to the relaying electrode 236, the ITO film is formed to be buried in the contact hole, the ITO film is patterned, and then the pixel electrode 141 is formed at the predetermined position surrounded by the signal line 132, the common feeding line 133 and the scanning line (not shown) to be electrically connected to the source drain region 143a. Here, the portion interposed by the signal line 132, the common feeding line 133, and further the scanning line (not shown) is to be a hole injecting layer or light-emitting layer formation location, described below.

Next, as shown in FIG. 7(a), the partition wall 150 is formed to surround the aforementioned formation location. The partition wall 150 serve as a dividing member and it is preferable that it is formed with an insulating organic material such as, for example, polyimide, etc. The film thickness of the partition wall 150 is set to be, for example, 1 to 2 μm. Further, it is preferable that the partition wall 150 has incompatibility over the liquid material composition ejected from the liquid droplet ejecting head 20. In order to implement the incompatibility to the partition wall 150, for example, such a method that a surface treatment by using a fluorine compound is carried out over the surface of the partition wall 150 is employed. The fluorine compound includes, for example, $CF_4$, $SF_5$, or $CHF_3$, etc., and the surface treatment includes, for example, a plasma treatment, or UV irradiation treatment, etc.

Furthermore, by this construction, step difference 111 having sufficient height is formed between the hole injecting layer or light-emitting layer formation location, that is, the applying position of the formation materials for them and the partition wall 150 surrounding them.

Next, as shown in FIG. 7(b), under the state of the top surface of the substrate P being faced up, the liquid material composition 114A containing the hole injecting layer formation material is selectively applied on the applying position surrounded by the partition wall 150 (that is, within the partition wall 150) with the liquid droplet ejecting head 20.

The liquid material composition 114A for forming the hole injecting layer is generated by liquid material composition generating device S and it contains the hole injecting layer formation material, the solvent, and the surfactant.

The hole injecting layer formation material includes, for example, polyphenylenevinylene of which polymer precursor is polytetrahydrothiophenylphenylene, 1,1-bis-(4-N,N-distyrylaminophenyl)cyclohexane, tris(8-hydroxy quinolinol)aluminum, bitron P, or polystylenesulfonate, etc.

Further, such polar solvent as isopropylalcohol, N-methylpyrrolidone, 1,3-dimethyl-imidazolinone, etc., may be used as a solvent.

For example, "SABINOL(a trade name)" manufactured by NISSIN CHEMICAL INDUSTRY CO., LTD. may be used as a surfactant. The surfactant is a surfactant having function of enhancing wettability over the base substrate and function of antifoaming. Since the surfactant is contained in the liquid material composition, it is possible to remedy the flight curvatures of liquid droplets due to the bubbles in the passage (pipe 31, etc.) and the bubbles in the liquid material composition at the time of ejection from the liquid droplet ejecting head. Further, in the case that the surfactant is added to the liquid material composition having high surface tension over the base substrate, it is possible to enhance the wettability of the liquid material composition over the base substrate. Further, by enhancing the wettability over the base substrate, it is possible to make the film thickness uniform after the film formation. Further, since the smoothness of the film surface after the film formation is enhanced, the wettablility of the liquid material composition to be formed on the next layer is enhanced at the time of the layer formation by liquid droplet ejecting method.

It is preferable that the hydrophilic-lipophilic balance (HLB value) of the used surfactant is 1 to 20. By doing so, the surfactant has appropriate hydrophilic and lipophilic properties and sufficiently performs the function as a surfactant. Here, in the case that the used solvent is a water system solvent, it is preferable that the HLB value is 4 to 20, and more preferably 6 to 16. On the other hand, in the case that the used solvent is an organic system solvent, it is preferable that the HLB value is 1 to 16, and more preferably 3 to 12.

It is preferable that the added quantity of the surfactant in the solution is 0.01 to 5.0 wt %, and more preferably 0.05 to 0.5 wt %. By regulating the added quantity in the aforementioned range, it is possible to obtain the desired function and at the same time not to damage the functions of the organic EL layer itself.

Further, it is preferable that the surfactant is transparent or semitransparent. By doing so, it is possible to avoid colorization of the hole ejecting layers due to the surfactant, to suppress the influence of the surfactant on light-emitting color such as changes of the light-emitting color and deterioration of luminance of the organic EL device, and thus, it is possible to obtain desired chromogenic states. Further, when the added quantity of the surfactant over the hole injecting layer is sufficiently small, the influence on the light-emitting color may be weak even if the surfactant is colorized.

When the liquid material composition 114A containing the aforementioned hole injecting layer formation material, solvent and surfactants is ejected from the liquid droplet ejecting head 20 on the substrate P, since it has high fluidity, it has tendency of extend in the horizontal direction, but since partition wall 150 is formed to surround the applied position, it is possible to prevent the liquid material composition 114A from extending over the partition wall 150 in the exterior thereof.

Next, as shown in FIG. 7(c), the solvent of the liquid material composition 114A is vaporized by heating or light irradiation, thereby forming the solid state hole injecting layer 140A on the pixel electrode 141A. Alternatively, sintering may be carried out at a predetermined temperature and during a predetermined time period (for example, 200° C. and 10 minutes) under the atmosphere environment or under the nitrogen gas ambient. Alternatively, the solvent may be removed by being disposed under the pressure environment (under the vacuum environment) of below atmospheric pressure.

Next, as shown in FIG. 8(a), under the state of the top surface of the substrate P being faced up, the liquid material composition 114B containing the light-emitting layer formation material (light-emitting material), the solvent, and the surfactant is selectively applied on hole injecting layer 140A in the partition wall 150 from the liquid droplet ejecting head 20.

For example, the material that is made of a precursor of conjugated system polymer organic compound and a fluorescent dye for changing the light-emitting characteristics of the obtained light-emitting layer is suitably used as the emitting layer formation material to be the emitting material.

The precursor of the conjugated system polymer organic compound denotes the one that is ejected from the liquid droplet ejecting head 20 with the fluorescent dye, etc., thereby forming a thin film, and then is cured by heating as shown the following formula (I) for instance, thereby generating a light-emitting layer which is to be the conjugated system polymer organic EL layer, and for example, in case of the precursor of the sulfonium salt, it is subjected to heat treatment to remove the sulfonate group, thereby becoming a conjugated system polymer organic compound.

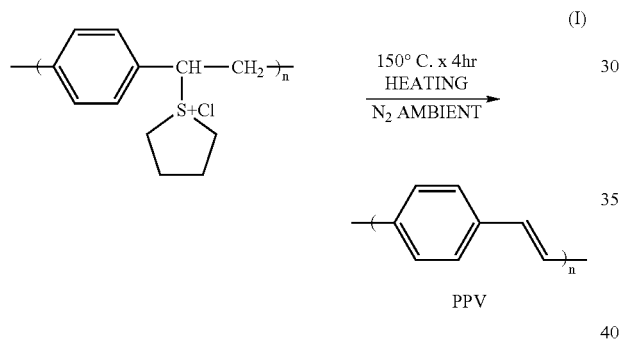

The conjugated system polymer organic compound has strong fluorescence in a solid state, and therefore, it is possible to form a homogeneous solid super thin film. Further, it has sufficient formation ability and high adhesion to an ITO electrode.

Further, since the precursor of the such compound forms a robust conjugated system polymer film after being cured, it is possible to adjust the solution of the precursor to the desired viscosity which is applicable to liquid droplet ejecting patterning described below before being cured by heating and it is possible to simply form a film having the optimum of its conditions in a short time.

Such precursor preferably includes, for example, the precursor of PPV (poly(paraphenylenevinylene)) or the derivatives. The precursor of PPV or the derivatives is soluble to water or organic solvent, and since it can be polymerized, it is possible to obtain a thin film having high optical quality. Further, since PPV has a robust fluorescence and is also a conductive polymer of which π electrons in its double bond is non-polarized in its polymer chains, it is possible to obtain an organic EL element having high performance.

The precursor of such PPV or the PPV derivatives includes, for example, PPV (poly(paraphenylenevinylene)) precursor, MO-PPV(poly(2,5-dimethoxy-1,4-phenylenevinylene)) precursor, CN-PPV(poly(2,5-bishexyloxy-1,4-phenylene-(1-cyanovinylene))) precursor, MEH-PPV(poly[2-methoxy-5-(2'-ethylhexyloxy)]-paraphenylenevinylene) precursor, etc., as shown in the following chemical formula (II).

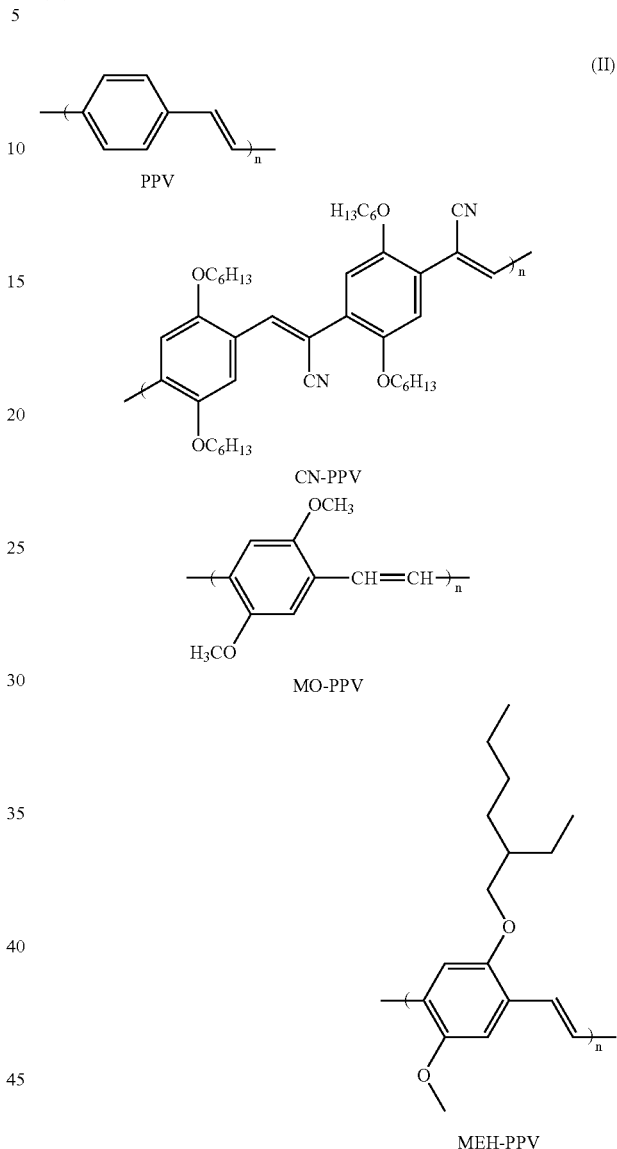

The precursor of PPV or the PPV derivatives is soluble in water, described above, and it is polymerized by heating after the film formation, thereby forming PPV layer. It is preferable that the content of the precursor to which the aforementioned PPV precursor is representative is 0.01 to 10.0 wt % and more preferably 0.1 to 5.0 wt % to the whole composition. If the added quantity of the precursor is too small, it is insufficient to form the conjugated system polymer film, and if it is too large, the viscosity of the composition become higher, therefore it may not be suitable to patterning having high accuracy by the inkjet method.

It is preferable that the light-emitting layer formation material contains at least one type of fluorescent dye. By doing so, it is possible to change the light-emitting characteristics of the light-emitting layer, and for example, it is effective means for enhancing the light-emitting efficiency of the light-emitting layer or changing the light absorption peak wavelength (light-emitting color). That is, the fluorescent dye is not merely a light-emitting layer material but it can be used as a dye material for performing the light-emitting function itself. For example, most of the excitation energy generated by carrier re-coupling on the conjugated system polymer organic compound molecule can be moved onto the fluorescent dye molecule. In the case, since the light-emitting is generated only from the fluorescent dye molecule having high fluorescent quantum efficiency, the current quantum efficiency of the light-emitting layer is also increased. Therefore, if the fluorescent dye is added into the light-emitting layer formation material, at the same time the light-emitting spectrum of the light-emitting layer belongs to the fluorescent molecule, so that it may be effective means for changing the light-emitting color.

Further, the aforementioned current quantum efficiency is a criterion for considering the light-emitting performance based on the light-emitting function, and defined as follows.

$\eta E$=emitted photon energy/input electrical energy

Further, it is possible to emit, for example, three primary colors of red, blue, and green by changing the light absorption peak wavelength due to doping of the fluorescent dye, and as a result, it is possible to obtain a full color display body.

Further, it is possible to largely enhance the light-emitting efficiency of the EL element by doping the fluorescent dye.

In the case that the light-emitting layer emitting the chromophoric light of red is formed, it is preferable that rhodamine having chromophoric light of red or the rhodamine derivatives is used as the fluorescent dye. Since these fluorescent dyes are low-molecules, they are soluble to an aqueous solution and have good compatibility to PPV, and thus it is possible to easily form a uniform and stable light-emitting layer. These fluorescent dyes specifically include rhodamine B, rhodamine B base, rhodamine 6G, or rhodamine 101 perchloric acid, etc., and they may be mixture of at least two types thereof.

Further, in the case that the light-emitting layer emitting the chromophoric light of green is formed, it is preferable that quinacridone having chromophoric light of green or the derivatives is used. Since these fluorescent dyes are low-molecules similar to the red fluorescent dye, they are soluble to an aqueous solution and have good compatibility to PPV, and thus it is possible to easily form a light-emitting layer.

Further, in the case that the light-emitting layer emitting the chromophoric light of blue is formed, it is preferable that distyrylbiphenyl having chromophoric light of blue or the derivatives is used. Since these fluorescent dyes are low-molecules similar to the red fluorescent dye, they are soluble to a water/alcohol mixture solution and have good compatibility to PPV, and thus it is possible to easily form a light-emitting layer.

Further, the other fluorescent dyes having chromophoric light of blue include coumarin and the derivatives. Since these fluorescent dyes are low-molecules similar to the red fluorescent dye, they are soluble to an aqueous solution and have good compatibility to PPV, and thus it is possible to easily form a light-emitting layer. These fluorescent dyes specifically include coumarin, coumarin-1, coumarin-6, coumarin-7, coumarin 120, coumarin 138, coumarin 152, coumarin 153, coumarin 311, coumarin 314, coumarin 334, coumarin 337, or coumarin 343, etc.

Further, the other fluorescent dyes having chromophoric light of blue include tetraphenylbutadiene (TPB) or the TPB derivatives. Since these fluorescent dyes are low-molecules similar to the red fluorescent dye, they are soluble to an aqueous solution and have good compatibility to PPV, and thus it is possible to easily form a light-emitting layer.

The aforementioned fluorescent dyes may be used in a manner that one type of them or mixture of at least two types is used for each color.

It is preferable that these fluorescent dyes are added to the precursor solid of the aforementioned conjugated system polymer organic compound in 0.5 to 10 wt % thereof, and more preferably in 1.0 to 5.0 wt % thereof. If the added quantity of the fluorescent dyes is too large, it is difficult to preserve the weather resistance and the durability of the light-emitting layer, and on the other hand, if the it is too small, it is difficult to obtain the aforementioned effects of the adding of the fluorescent dyes.

Further, it is preferable that the aforementioned precursors and the fluorescent dyes are dissolved or dispersed into an polar solvent to be a liquid material composition and the liquid material composition is ejected from liquid droplet ejecting head 20. Since the polar solvent can easily dissolve or uniformly disperse the aforementioned precursors, the fluorescent dyes, etc., it is possible to prevent the solids of the light-emitting layer formation material in the nozzle openings of the liquid droplet ejecting head 20 from being attached or clogging.

These polar solvents specifically includes water, alcohol having compatibility to water such as methanol and ethanol, organic solvents such as N, N-dimethylformamide (DMF), N-methylpyrrolidone (NMP), dimethylimidazoline (DMI), dimethylsulfoxide (DMSO), xylene, cyclohexylbenzene, or 2,3-dihydrobenzofuran, or inorganic solvents, and may be a appropriate mixture of at least two types solvents thereof.

The aforementioned surfactant ("SABINOL") may be used as a surfactant added to the light-emitting layer. It is preferable to use the surfactant added to the light-emitting layer, of which the HLB value is also 1 to 20. These surfactants have compatibility to the light-emitting layer formation material and are sufficiently dispersed, so that they may not generate bubbles.

Further, it is preferable that the surfactant contained in the light-emitting layer is also transparent or semitransparent. By doing so, it is possible to avoid colorization of the light-emitting layer due to the surfactant, to suppress the influence of the surfactant on light-emitting color such as changes of the light-emitting color, deterioration of luminance, etc., and thus, it is possible to obtain desired chromogenic states. Further, when the added quantity of the surfactant over the light-emitting layer formation material is sufficiently small, the influence on the light-emitting color may be weak even if the surfactant is colorized.

Further, it is preferable that a wetting agent is added to the aforementioned formation material. By doing so, it is possible to effectively prevent the formation material from being dried and coagulated in the nozzle openings of the liquid droplet ejecting head 20. These wetting agents include, for example, polyhydric alcohols such as glycerin, diethyleneglycol, etc., and may be a mixture of at least two types thereof. It is preferable that the added quantity of the wetting agent is 5 to 20 wt % of total quantity of the formation material.

Further, the other addition agents and coating stabilization materials may be added, and for example, stabilizers, viscosity control agents, antioxidants, pH control agents, antiseptic, resin emulsion, and leveling agents may be used.

When the liquid material composition 114B containing these light-emitting formation materials is ejected from the liquid droplet ejecting head 20, the liquid material composition 114B is applied on the hole injecting layer 140A in the partition wall 150.

Here, the formation of the light-emitting layer by the ejecting of the liquid material composition 114B is carried out by ejecting and applying the liquid material composition containing the light-emitting formation material emitting chromophoric light of red, the liquid material composition containing the light-emitting layer formation material emitting chromophoric light of green, and the liquid material composition containing the light-emitting layer formation material emitting chromophoric light of blue to the corresponding pixels 71, respectively. Further, each of the pixels 71 corresponding to each color is predetermined to be disposed in a regular manner.

By doing so, the liquid material composition 114B containing the light-emitting layer formation material of each color is ejected and applied and then the solvent in the liquid material composition 114B is vaporized, thereby forming the solid light-emitting layer 140B on the hole injecting layer 140A as shown in FIG. 8(b), and thus it is possible to obtain the light-emitting portion 140 comprising the hole injecting layer 140A and the light-emitting layer 140B. Here, although the vaporization of the solvent in the liquid material composition 114B containing the light-emitting layer formation material is carried out with the treatments, if necessary, such as heating, decompression, etc., but since the light-emitting layer formation material typically has good drying capability and thus is rapidly dryable, it is possible to form the light-emitting layer 140B of each color in the applying sequence by ejecting and applying the light-emitting layer formation material of each color in the sequence without any of these treatments being carried out.

After that, as shown in FIG. 8(c), the reflective electrode 154 is formed on the entire surface of the transparent substrate P or in a stripe shape. By doing so, the organic EL element is manufactured.

In the method of manufacturing the organic EL element, since the thin film which is to be components of the organic EL element such as the hole injecting layer 140A or the light-emitting layer 140B is manufactured by the film formation device (liquid droplet ejecting device) IJ, the loss of the liquid material composition which is to be the formation material of the hole injecting layer 140A or the light-emitting layer 140B is small, and the hole injecting layer 140A or the light-emitting layer 140B is relatively inexpensively and stably formed.

Further, although the aforementioned embodiment has the construction that the surfactant is previously added to the liquid material compositions 114B (114A), it may have the construction that after the liquid material compositions 114B (114A) which is not added by the surfactant are ejected and then the film is formed, the surfactant is ejected and applied to the film. In this case, before the film containing the light-emitting layer formation material is dried (heat treatment), that is, under the state of the film being wetted, the surfactant may be applied. By doing so, it is possible to mix the light-emitting layer formation material and the surfactant on the substrate P.

Further, in the aforementioned embodiment, although the film is formed with organic functional material by liquid droplet ejecting method by using the liquid droplet ejecting device IJ, it is not limited to the liquid droplet ejecting method, and for example, the other applying methods such as spin coating method, etc., may be used. Further, the other applying methods may be also used when the aforementioned second liquid material composition is applied.

Further, the liquid material composition generating process or the film formation process may be carried out under the atmosphere environment or under the inert gas ambient such as nitrogen gas ambient, etc. Furthermore, it is preferable that the liquid material composition generating process by the liquid material composition generating device S or the film formation process by liquid droplet ejecting device IJ is carried out under the environment that the particle cleanness and chemical cleanness are ensured in the clean room. When the liquid material composition is generated under the atmosphere environment, the liquid material composition may be generated by dissolving the organic functional material and the surfactant in the solvent, for example, under the normal temperature and normal humidity (as an example, 25° C. of temperature and 35 to 45% of humidity) environment and may be generated by dissolving the organic functional material in the solvent and then adding the surfactant to the solution.

Although the aforementioned embodiment has the construction that the surfactant is added to each of the hole injecting layer and the light-emitting layer, it may have the construction that the surfactant is added to the only any one of the hole injecting layer and the light-emitting layer. Further, the surfactant may be added to the other layers besides the hole injecting layer and the light-emitting layer among the plurality of layers constituting the organic EL element.

EXAMPLES

Now, examples of the material composition of the liquid material composition, the liquid material composition generation process, and the film formation process will be disclosed.

<Hole Injecting Layer forming Liquid material Composition P1> bitron P: 88.4 wt % polystylenesulfonate: 11.5 wt % sabinol 61 (HLB value: 6): 0.12 wt %

<Hole Injecting Layer forming Liquid material Composition P2> bitron P: 88.5 wt % polystylenesulfonate: 11.5 wt %

<Light-emitting Layer forming Liquid Material Composition E1>

G (green): compound 1 (0.76 g), compound 2 (0.20 g), compound 3 (0.04 g)

B (blue): compound 1 (1.00 g)

R (red): compound 4 (1.00 g)

Xylene of 100 ml is added to each of the RGB as a solvent.

Further, the compounds 1 to 4 are as follows.

Formula 3

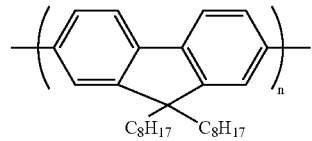

COMPOUND 1

Formula 4

COMPOUND 2

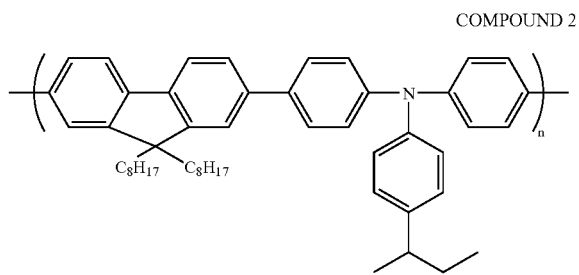

Formula 5

COMPOUND 3

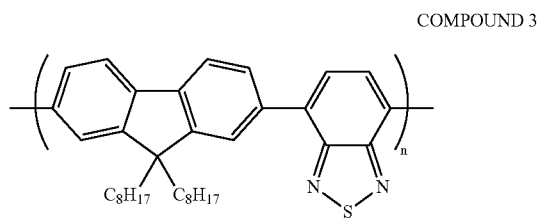

Formula 6

COMPOUND 4

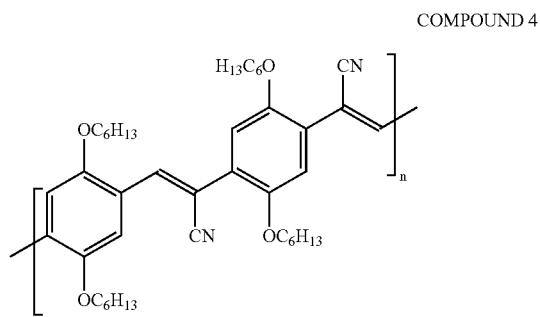

<Hole Injecting Layer forming Liquid material Composition P3>
bitron P: 11.08 wt %
polystylenesulfonate: 1.44 wt %
isoprophylalcohol: 10 wt %
N-methylpyrrolidone: 27.47 wt %
1,3-dimethyl-imidazolinone: 50 wt %
sabinol 61 (HLB value: 6): 0.01 wt %

<Hole Injecting Layer forming Liquid material Composition P4>
bitron P: 11.08 wt %
polystylenesulfonate: 1.44 wt %
isoprophylalcohol: 10 wt %
N-methylpyrrolidone: 27.47 wt %
1,3-dimethyl-imidazolinone: 50 wt %

<Light-emitting Layer forming Liquid Material Composition E2>
G (green): compound 1 (0.76 g), compound 2 (0.20 g), compound 3 (0.04 g)
B (blue): compound 1 (1.00 g) R (red): compound 4 (1.00 g)Cyclohexylbenzene of 40 ml and 2,3-dihydrobenzofuran of 60 ml are added to each of the RGB as solvents.

<Liquid Material Composition Generation Process 1>
(Process Example 1) After regulating the hole injecting layer formation material under the clean room atmosphere environment (room temperature of 25° C. and humidity of 35 to 45%), the surfactant was added and the composition P1 was generated.

(Process Example 2) After mixing the hole injecting layer formation material and the solvent under the clean room atmosphere environment (room temperature of 25° C. and humidity of 35 to 45%), the surfactant was added thereto and the composition P3 was generated.

<Film Formation Process 1>
(Process Example 1) First, the film formation of the composition P1 was carried out by the spin coating method under the clean room atmosphere environment (room temperature of 25° C. and humidity of 35 to 45%). Next, the film formed by the composition P1 was sintered at 200° C. under the atmosphere environment for 10 minutes. Next, the film formation of the composition E1 was carried out on the formed hole injecting layer by the spin coating method at room temperature under the atmosphere environment.

(Process Example 2) The composition P3 was ejected on the substrate by the liquid droplet ejecting method under the clean room atmosphere environment (room temperature of 25° C. and humidity of 35 to 45%). Next, after making the pressure of the clean room be at the vacuum state of 1 Torr (133.322 Pa or less), drying treatment was carried out at the room temperature for 20 minutes, thereby forming the film. Next, the film was sintered at 200° C. under the atmosphere environment for 10 minutes. Next, the composition E2 was ejected on the formed hole injecting layer by the liquid droplet ejecting method. Next, drying treatment was carried out over the film made of the composition E2 at 45° C. under the atmosphere environment for 20 minutes, thereby forming the film.

<Liquid Material Composition Generation Process 2>
(Process Example 1) After regulating the hole injecting layer formation material under the glove box nitrogen gas ambient (room temperature, moisture concentration and oxygen concentration of 1 ppm or less), the surfactant was added and the composition P1 was generated.

(Process Example 2) After mixing the hole injecting layer formation material and the solvent under the glove box nitrogen gas ambient (room temperature, moisture concentration and oxygen concentration of 1 ppm or less), the surfactant was added to the solution and the composition P3 was generated.

<Film Formation Process 2>
(Process Example 1) The film formation of the composition P1 was carried out by the spin coating method under the nitrogen gas ambient having the moisture concentration and the oxygen concentration of 1 ppm or less. Next, the film formed by the composition P1 was sintered at 200° C. under the nitrogen gas ambient for 10 minutes. Next, the film formation of the composition E1 was carried out on the formed hole injecting layer by the spin coating method at room temperature under the nitrogen gas ambient.

(Process Example 2) The composition P3 was ejected on the substrate by the liquid droplet ejecting method under the nitrogen gas ambient having the moisture concentration and the oxygen concentration of 1 ppm or less. Next, under the vacuum condition of 1 Torr (133.322 Pa or less), drying treatment was carried out at the room temperature for 20 minutes, thereby forming the film.

Next, the film was sintered at 200° C. under the nitrogen gas ambient for 10 minutes. Next, the composition E2 was ejected on the formed hole injecting layer by the liquid droplet ejecting method and then drying treatment was carried out at 45° C. under nitrogen gas ambient for 20 minutes, thereby forming the film.

FIGS. 9 to 12 illustrate results of the characteristic tests of the organic EL elements in each of the case that the surfactant was added to the light-emitting layer and the case that it was not added thereto. In the drawings, "A" denotes the test results of the case that the surfactant according to the present invention was added and "B" denotes the test results of the case that the surfactant was not added. FIG. 9 is a graph illustrating the relation between the applied voltage and the current densities. FIG. 10 is a graph illustrating the relation between the applied voltage and the luminance. Further, FIG. 11 is a graph illustrating the relation between the applied voltages and the light-emitting efficiency and FIG. 12 is a graph illustrating the relation between the driving time and the luminance. As shown in FIGS. 9 and 10, it is found that the element characteristics of the organic EL element to which was added by the surfactant and the organic EL element to which was not added by the surfactant are substantially equal and the function of the element is not substantially damaged even though the surfactant is added to the light-emitting layer. Further, as shown in FIGS. 11 and 12, it is found that the light-emitting efficiency and luminance half-life is enhanced by adding the surfactant and the function of the element is enhances by adding the surfactant.

The liquid droplet ejecting device IJ according to the present invention may be used to form a film which is to be components of the color filter. FIG. 13 is a view illustrating the color filter formed on the substrate P and the FIG. 14 is a view illustrating the sequence of manufacturing the color filter.

As shown in FIG. 13, in the present example, a plurality of color filter regions 351 are formed in a matrix shape in terms of enhancing the productivity on the substrate P having shape of a rectangle. These color filter regions 351 can be used as the color filters suitable to the liquid crystal display device by later cutting the substrate P.

The liquid material compositions of R (red), the liquid material compositions of G (green), and the liquid material compositions of B (blue) are formed on the color filter regions 351 in respective predetermined patterns which are formed in conventionally well known stripe types in the present example. Further, the formation pattern may be a mosaic type, a delta type, a square type, etc., besides the stripe type. Furthermore, the aforementioned surfactant is added to the liquid material compositions of each of the RGB.

In order to form these color filter regions 351, a black matrix 352 is firstly formed over the one side surface of the transparent substrate P, as shown in FIG. 14(a). The method of forming the black matrix 352 is carried out by applying a resin (preferably, black) having no light transparent property in a predetermined thickness (for example, about 2 μm) by the spin coating method, etc. A minimal displaying component surrounded by a lattice of the black matrix 352, that is, filter element 353 has, for example, width of about 30 μm in the direction of the X axis and length of about 100 μm in the direction of the Y axis.

Next, as shown in FIG. 14(b), the liquid droplets 354 of the liquid material composition are ejected from the aforementioned liquid droplet ejecting head 20 and impacted to the filter element 353. The sufficient quantity of the ejected liquid droplets 354 is taken in consideration of the volume reduction of the liquid material composition in the heat process.

By doing so, when all the filter elements 353 on the substrate P are filled with the liquid droplets 354, the heat treatment is carried out over the substrate P to be a predetermined temperature (for example, about 70° C.) with a heater. By the heat treatment, the solvent of the liquid material composition is vaporized and then the volume of the liquid material composition is reduced. In the case that the volume reduction is excessive, the liquid droplet ejecting process and the heat process are repeated until the film thickness suitable to the color filter is obtained. By these treatments, the solvent contained in the liquid material composition is vaporized and then the only solids contained in the liquid material composition is finally remains to form a film and to become a color filter 355, as shown in FIG. 14(c).

Next, the substrate P is planarized, and also, in order to protect the color filter 355, a protective film 356 is formed on the substrate P to cover the color filter 355 and black matrix 352, as shown in FIG. 14(d). At the time of forming the protective film 356, although the spin coating method, a roll coating method, and a ripping method may be employed, the liquid droplet ejecting method may be carried out similar to the color filter 355.

Next, as shown in FIG. 14(e), a transparent conductive film 357 is formed on the entire surface of the protective film 356 by sputtering method, vacuum deposition method, etc. After that, the transparent conductive film 357 is patterned, and as shown in FIG. 14(f), the pixel electrode 358 is patterned with the filter element 353 being corresponded thereto. Further, this patterning is unnecessary in the case that the TFT (Thin Film Transistor) are used to drive the liquid crystal display panel.

Further, the film formation method according to the present invention may be employed at the time of forming a film which will become components of a liquid crystal element using the substrate P on which the aforementioned color filter 355 is formed. That is, the liquid crystal device can be formed with manufacturing the well known liquid crystal cell by using the aforementioned substrate P to be the liquid crystal element. FIG. 15 is a view for describing the structure of the liquid cell in order to form this liquid crystal element, and the liquid crystal device comprises the opposite substrate 360 which is a substrate on which the color filter (not shown in FIG. 15) is formed. The opposite substrate 360 is disposed at the opposite side to a circuit substrate (not shown) on which TFTs, etc., are formed. In the inner side of the opposite substrate 360, a plurality of micro lenses 361 are disposed to condense incident light from the opposite substrate 360 side to the circuit substrate (not shown) side, a cover glass 363 is adhered to the side to which the micro lenses 361 are formed by an adhesive 362.

In the inner side of the cover glass 363, each of light shielding films 364 is formed at the position corresponding to each of the boundaries between the micro lenses 361, and under the state of covering thereof, and the opposite electrode 365 made of a transparent conductive material such as ITO is further formed on the substantial entire surface of the cover glass 363. Furthermore, an oriented film 366 made of an organic thin film such as polyimide thin film, etc., is formed to the inner side of the opposite electrode 365, and liquid crystals 367 are sealed between the formed opposite substrate 360 and the aforementioned circuit substrate, thereby constructing the liquid crystal device.

In the method of manufacturing the liquid crystal device having this construction, the surfactant is also previously added to the liquid material composition at the time of forming the thin films which are to be components of the liquid element, for example, the light shielding film 364 or the oriented film 366, and then the film is formed by using the liquid material composition.

Further, the film formation method according to the present invention may be employed at the time of forming a film which will become components of an organic TFT element (organic thin film transistor element) of which at least the channel regions is formed with an organic film. The organic TFT element includes, for example, the one having the construction as shown in FIG. 16.

In FIG. 16, a gate electrode 451 is formed on a substrate 450. Further, a gate insulating film 452 made of an insulating material having high dielectric constant under the state of covering the gate electrode 451 is formed on the substrate 450, and an organic semiconductor layer 453 is formed on the gate insulating film 452. Furthermore, a source electrode 454 and a drain electrode 455 are formed on the organic semiconductor layer 453, thereby forming the organic TFT element (organic thin film transistor element).

In order to manufacture the organic TFT element, a gate electrode material is firstly disposed on the substrate 450, thereby forming the gate electrode 451. Next, the gate insulating film 452 is formed under the state of covering the gate electrode 451. The formation material for the gate insulating film 452 is not limited, but various ones may be used therefore. Particularly, as an insulating materials having high dielectric constant, metal oxide thin film may be used, and more preferably, inorganic materials such as barium strontium titanate, barium zirconate titanate, lead zirconate titanate, lead lanthanum titanate, strontium titanate, barium titanate, barium magnesium fluoride, bismuth titanate, strontium bismuth titanate, strontium bismuth tantalate, bismuth tantalate niobate, strontium bismuth tantalate niobate, tantal pentoxide, titan dioxide, yttrium trioxide, tantal oxide, vanadium oxide, titan oxide, etc., are suitably used. Further, organic materials such as polychloropyrene, polyethyleneterephthalate, polyoxymethylene, polyvinylchloride, polyvinylidenefluoride, cyanoethylpullulan, polymethylmethacrylate, polysulfone, polycarbonate, polyimide, etc., also may be used. Furthermore, particularly, in the case that the gate insulating film 452 is formed with the aforementioned inorganic materials, after the film formation, annealing treatment thereof at an appropriate temperature within the range of 150 to 400° C. is performed, but can preferably enhance the film quality and increase the dielectric constant.

Next, the organic semiconductor layer 453 is formed on the gate insulating film 452. The liquid droplet ejecting device IJ is appropriately used at the time of forming the organic semiconductor layer 453. A polymer semiconductor or an oligomer semiconductor layer of which the electric field effect mobility is increased in accordance with the gate voltage being increased is used as a formation material for the organic semiconductor layer 453, and more specifically, at least one types of naphthalene, anthracene, tetracene, pentacene, hexacene, their derivatives, or polyacetylene is used.

Furthermore, in particular, in case for p-channel, an oligomer of thiophene which is coupled by interposing 2 to 5 carbon atoms and has oligo polymerization degree of 4 or more and 8 or less; an alternating conjugate oligomer of vinylene and thienylene which is coupled by interposing 2 to 5 carbon atoms and has 3 to 6 thiophene rings and thiophene as a terminal group; a linear dimer and trimmer of benzo[1,2-b:4,5'] dithiophene; the aforementioned oligomer having substituent (for example, alkyl substituent having 1 to 20 carbon atoms) on 4 or 5 carbon atoms of terminal thiophene; p,p'-diamino biphenyl complex in a polymer matrix, etc., may be used, and more particularly α-hexatienylene (α-6T) is suitably used. Further, in case for p-channel, 1, 4, 5, 8-naphthalene tetracarboxylic dianhydride (NTCDA), 1, 4, 5, 8-naphthalene tetracarboxylic diimide (NTCDI), 11, 11, 12, 12-tetracyanonaphtho-2,6-quinodimethane (TCNNQD), etc., may be used.

When the films of these organic semiconductor materials are formed by the aforementioned liquid droplet ejecting device IJ, the organic semiconductor materials are firstly dissolved into the solvent, and at the same time the aforementioned surfactant is added, thereby generating the liquid material composition. And then, the liquid material composition is ejected and applied on the gate insulating film 452 of the substrate 450. Next, drying is appropriately carried out by heating or decompression, etc., and thus the solvent is removed, thereby forming the organic semiconductor layer 453. After that, a source electrode 454 and a drain electrode 455 are formed on the organic semiconductor layer 453, thereby obtaining the organic TFT element.

Further, the liquid droplet ejecting device according to the present invention or a film formation device comprising it, and moreover the liquid material composition according to the present invention are not limited to each of the embodiments, but may be usable for various uses. For example, it is possible to directly carry out patterning over metal wire by the liquid material composition being generated with a silver colloid solution, etc., along with the surfactant, being ejected and applied on the substrate, and then being heated to be dried.

An electro-optical device comprising the organic EL device and liquid crystal device according to the present invention or a device comprising the organic TFT element according to the present invention is employed to various electronic apparatus having display portions. Now, examples of the application of the electronic apparatus comprising the electro-optical device according to the present invention will be described.

1. Wrist Watch

An example in which the electro-optical device according to the present invention is applied to a wrist watch will be described. FIG. 17 is a perspective view illustrating a construction of the wrist watch, and the wrist watch 1100 comprises the electro-optical device according to the present invention as a display unit 1101.

2. Mobile Type Computer

An example in which the electro-optical device according to the present invention is applied to a mobile type (portable type) personal computer will be described. FIG. 18 is a perspective view illustrating a construction of the personal computer, and the personal computer 1200 comprises the electro-optical device according to the present invention as a display unit 1201. The personal computer 1200 is constructed with comprising a main body portion 1202 having a keyboard 1203.

3. Mobile Phone

An example in which the electro-optical device according to the present invention is applied to a mobile phone will be described. FIG. 19 is a perspective view illustrating a construction of the mobile phone, and the mobile phone 1300 comprises the electro-optical device according to the present invention as a small-sized display unit 1301. The mobile phone 1300 is constructed with comprising a plurality of functional buttons 1302, an earpiece 1303, and a mouthpiece 1304.

4. Electronic Paper

An example in which the electro-optical device according to the present invention is applied to a flexible electronic paper will be described. FIG. 20 is a perspective view illustrating a construction of the electronic paper, and the electronic paper 1400 comprises the electro-optical device according to the present invention as a display unit 1401. The electronic paper 1400 is constructed with comprising a main body 1402 which consists of rewritable sheet having flexibility and giving textual feeling similar to the conventional paper.

Further, FIG. 21 is a perspective view illustrating a construction of an electronic note, and the electronic note 1500 is the one in which a plurality of the electronic papers 1400 shown in FIG. 21 are bound and interposed between covers 1501. The covers 1501 comprises, for example, display data input means (not shown) for inputting display data sent from external devices. By doing so, the display contents can be changed or updated under the state of the electronic papers being bound in accordance with the display data.

5. Display Device

Further, as shown in FIGS. 22(a) and 22(b), an example in which the electro-optical device according to the present invention is applied to a display device 1601 will be described. A display unit 1602 is detachably fixed to a frame 1601A of the display device 1601. The display unit 1602 is a recording media (so called, 'electronic paper') having a very thin sheet shape, that is, a paper shape, supported by carrying rollers 1604, 1606, and disposed at a predetermined position in the one side of the frame 1601A. The substantially central portion of the frame 1601A is formed to have a recess portion, a rectangular opening 1601C is formed on the recess portion, and a glass substrate 1607 is attached to the opening 1601C. Further, the display unit 1602 is inserted into the frame 1601A, and also, a separated insert/detach opening 1608 is provided. A terminal unit 1610 is disposed at the end portion in the inserting direction of the display unit 1602. The terminal unit 1610 is electrically connected to the socket 1612 within the frame 1601A, and by doing so, is connected a controller 1613 disposed at the other side of the frame 1601A.

Such a detachable display unit 1602 has good portability and at the same time it is not so thick to increase its volume, therefore it is easy to be dealt. For the reason, usage that only the display unit 1602 is carried while displaying a map with respect to areas of destinations is available.

Furthermore, in addition to the aforementioned examples, the other examples include a liquid crystal television, a view finder type or monitor viewable type of video tape recorder, a car navigation device, a pager, an electronic note, an electronic calculator, a word processor, a work station, a television telephone, a POS terminal, an apparatus comprising a touch panel, etc. The electro-optical device according to the present invention may be employed as a display portion of these electronic apparatuses.

As described above, since the surfactant is added to the solution made of the organic functional material and the solvent and liquidization thereof is carried out, it is possible to suppress the generation of the bubbles in the liquid material composition and to enhance the ejecting stability from the liquid droplet ejecting device, the wettability over the base substrate, or the smoothness of the film after the film formation. Furthermore, since various elements and devices are manufactured by using the liquid material composition, it is possible to provide good elements and devices having high reliability.

The entire disclosure of Japanese Patent Application No.2002-192195 filed Jul. 1, 2002 is hereby incorporated by reference.

What is claimed is:

1. An organic electroluminescent device having a plurality of material layers selectively applied on an applying position surrounded by a partition wall, wherein at least one material layer of the plurality of material layers contains a surfactant;

wherein each material layer containing the surfactant has a uniform thickness and a wettability that is greater than a material layer without the surfactant.

2. The organic electroluminescent device according to claim 1, wherein a light-emitting layer of the material layers contains the surfactant.

* * * * *